(12) United States Patent
Park et al.

(10) Patent No.: US 12,224,315 B2
(45) Date of Patent: Feb. 11, 2025

(54) SEMICONDUCTOR DEVICE

(71) Applicant: SAMSUNG ELECTRONICS CO., LTD., Suwon-si (KR)

(72) Inventors: Ju Hun Park, Seoul (KR); Won Cheol Jeong, Seongnam-si (KR); Jin Wook Kim, Hwaseong-si (KR); Deok Han Bae, Suwon-si (KR); Myung Yoon Um, Seoul (KR); In Yeal Lee, Seongnam-si (KR); Yoon Young Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 483 days.

(21) Appl. No.: 17/516,900

(22) Filed: Nov. 2, 2021

(65) Prior Publication Data

US 2022/0254881 A1    Aug. 11, 2022

(30) Foreign Application Priority Data

Feb. 8, 2021    (KR) ........................ 10-2021-0017279

(51) Int. Cl.
*H01L 29/06*      (2006.01)
*H01L 29/66*      (2006.01)

(52) U.S. Cl.
CPC ...... *H01L 29/0665* (2013.01); *H01L 29/6656* (2013.01)

(58) Field of Classification Search
CPC ......... H01L 21/02603; H01L 21/28141; H01L 21/76816; H01L 21/76829;
(Continued)

(56) References Cited

U.S. PATENT DOCUMENTS

| 6,511,911 B1 | 1/2003 | Besser et al. |
| 7,776,729 B2 | 8/2010 | Rachmady et al. |

(Continued)

FOREIGN PATENT DOCUMENTS

| TW | 201924048 A | 6/2019 |
| TW | 202018948 A | 5/2020 |

(Continued)

OTHER PUBLICATIONS

First Office Action dated Nov. 20, 2024 for the corresponding Taiwanese Patent Application TW 111100100.

*Primary Examiner* — David C Spalla
(74) *Attorney, Agent, or Firm* — Muir Patent Law, PLLC

(57) ABSTRACT

A semiconductor device includes an active pattern extending in a first direction on a substrate, a gate structure on the active pattern and having a gate electrode extending in a second direction intersecting the active pattern, and a gate capping pattern on the gate electrode, the gate capping pattern including a gate capping liner defining a gate capping recess, the gate capping liner having a horizontal portion along an upper surface of the gate electrode, and a vertical portion extending from the horizontal portion in a third direction intersecting the first and second directions, and a gate capping filling film on the gate capping liner and filling the gate capping recess, an epitaxial pattern on the active pattern and adjacent the gate structure, a gate contact on and connected to the gate electrode, and an active contact on and connected to the epitaxial pattern.

20 Claims, 34 Drawing Sheets

(58) Field of Classification Search
CPC ......... H01L 21/76834; H01L 21/76897; H01L 21/823431; H01L 21/823475; H01L 21/823821; H01L 21/845; H01L 23/535; H01L 27/0886; H01L 27/0924; H01L 27/1211; H01L 29/0653; H01L 29/0665; H01L 29/0669; H01L 29/0673; H01L 29/41791; H01L 29/66439; H01L 29/6653; H01L 29/66553; H01L 29/6656; H01L 29/66795; H01L 29/775; H01L 29/785; H01L 29/7851; H01L 29/7853; H01L 29/7855; H01L 2029/7858

See application file for complete search history.

(56) References Cited

U.S. PATENT DOCUMENTS

| | | |
|---|---|---|
| 7,816,218 B2 | 10/2010 | Klaus et al. |
| 8,450,216 B2 | 5/2013 | Teo et al. |
| 9,577,067 B2 | 2/2017 | Ho et al. |
| 10,103,250 B2 | 10/2018 | Lu et al. |
| 2019/0333812 A1* | 10/2019 | Seong ................. H01L 29/6656 |
| 2020/0144118 A1* | 5/2020 | Cheng ............... H01L 21/76831 |

FOREIGN PATENT DOCUMENTS

| | | |
|---|---|---|
| TW | 202025260 A | 7/2020 |
| TW | 202036904 A | 10/2020 |

\* cited by examiner

SEMICONDUCTOR DEVICE

CROSS-REFERENCE TO RELATED APPLICATION

This application claims the benefit of Korean Patent Application No. 10-2021-0017279, filed on Feb. 8, 2021, in the Korean Intellectual Property Office, the disclosure of which is incorporated herein in its entirety by reference.

BACKGROUND

1. Field

The present disclosure relates to a semiconductor device.

2. Description of the Related Art

As one of scaling technologies for increasing density of semiconductor devices, a multi gate transistor, in which a fin-shaped or nanowire-shaped multi-channel active pattern (or a silicon body) is formed on a substrate, and a gate is formed on a surface of the multi-channel active pattern, was proposed. Since such a multi gate transistor utilizes three-dimensional channels, scaling is easily performed. Further, even when a gate length of the multi gate transistor is not increased, current control capability may be improved. Furthermore, a SCE (short channel effect) in which potential of a channel region is influenced by a drain voltage may be effectively suppressed.

SUMMARY

According to an aspect of the present disclosure, there is provided a semiconductor device including, an active pattern extending in a first direction on a substrate, a first gate structure which is placed on the active pattern, and includes a first gate electrode intersecting the active pattern, and a first gate capping pattern on the first gate electrode, the first gate electrode extending in a second direction intersecting the first direction, a second gate structure which extends in the second direction and is spaced apart from the first gate structure in the first direction, a first epitaxial pattern placed between the first gate structure and the second gate structure, on the active pattern, a gate contact connected to the first gate electrode, on the first gate electrode and a first active contact connected to the first epitaxial pattern, on the first epitaxial pattern, wherein the first gate capping pattern includes a first gate capping liner which defines a first gate capping recess, and a first gate capping filling film which fills the first gate capping recess on the first gate capping liner, the first gate capping liner includes a first horizontal portion extending along an upper surface of the first gate electrode, and a first vertical portion which extends in a third direction intersecting the first direction and the second direction from the first horizontal portion of the first gate capping liner.

According to another aspect of the present disclosure, there is provided a semiconductor device including, an active pattern extending in a first direction on a substrate, a first gate structure which is placed on the active pattern, and includes a first gate electrode intersecting the active pattern, and a first gate capping pattern on the first gate electrode, the first gate electrode extending in a second direction intersecting the first direction, a second gate structure which extends in the second direction and is spaced apart from the first gate structure in the first direction, a first epitaxial pattern placed between the first gate structure and the second gate structure, on the active pattern, and a first active contact connected to the first epitaxial pattern, on the first epitaxial pattern, wherein the first gate capping pattern includes a first gate capping liner which defines a first gate capping recess, and a first gate capping filling film which fills the first gate capping recess, on the first gate capping liner, and the first gate capping liner is placed on a part of side walls of the first active contact and extends to an upper surface of the first active contact.

According to another aspect of the present disclosure, there is provided a semiconductor device including, an active pattern extending in a first direction on a substrate, a first gate structure which is placed on the active pattern, and includes a first gate electrode intersecting the active pattern, and a first gate capping pattern on the first gate electrode, the first gate electrode extending in a second direction intersecting the first direction, a second gate structure which extends in the second direction and is spaced apart from the first gate structure in the first direction, a third gate structure which extends in the second direction and is spaced apart from the second gate structure in the first direction, the second gate structure being placed between the first gate structure and the first gate structure, a first epitaxial pattern placed between the first gate structure and the second gate structure, on the active pattern, a second epitaxial pattern placed between the second gate structure and the third gate structure, on the active pattern, a gate contact connected to the first gate electrode, on the first gate electrode, a first active contact connected to the first epitaxial pattern, on the first epitaxial pattern, and a second active contact connected to the second epitaxial pattern, on the second epitaxial pattern, wherein the first gate capping pattern includes a first gate capping liner which defines a first gate capping recess, and a first gate capping filling film which fills the first gate capping recess on the first gate capping liner, and a lower surface of the gate contact is higher than an upper surface of the first active contact.

BRIEF DESCRIPTION OF THE DRAWINGS

Features will become apparent to those of skill in the art by describing in detail exemplary embodiments with reference to the attached drawings, in which.

DETAILED DESCRIPTION

Although the drawings of a semiconductor device according to some embodiments show a fin-type transistor (FinFET) including a channel region of a fin-type pattern shape, embodiments are not limited thereto. For example, embodiments may include a transistor having, e.g., a nanowire or a nanosheet, and a MBCFET™ (Multi-Bridge Channel Field Effect Transistor). The semiconductor device according to some embodiments may include a tunneling field effect transistor (FET) or a three-dimensional (3D) transistor. The semiconductor device according to some embodiments may include a planar transistor. In addition, embodiments may be applied to a transistor based on two-dimensional material (2D material based FETs) and a heterostructure thereof. Further, the semiconductor device according to some embodiments may also include a bipolar junction transistor, a laterally diffused metal oxide semiconductor (LDMOS), or the like.

The semiconductor device according to some embodiments will be described hereinafter referring to FIGS. 1 to 4.

Figure 1:
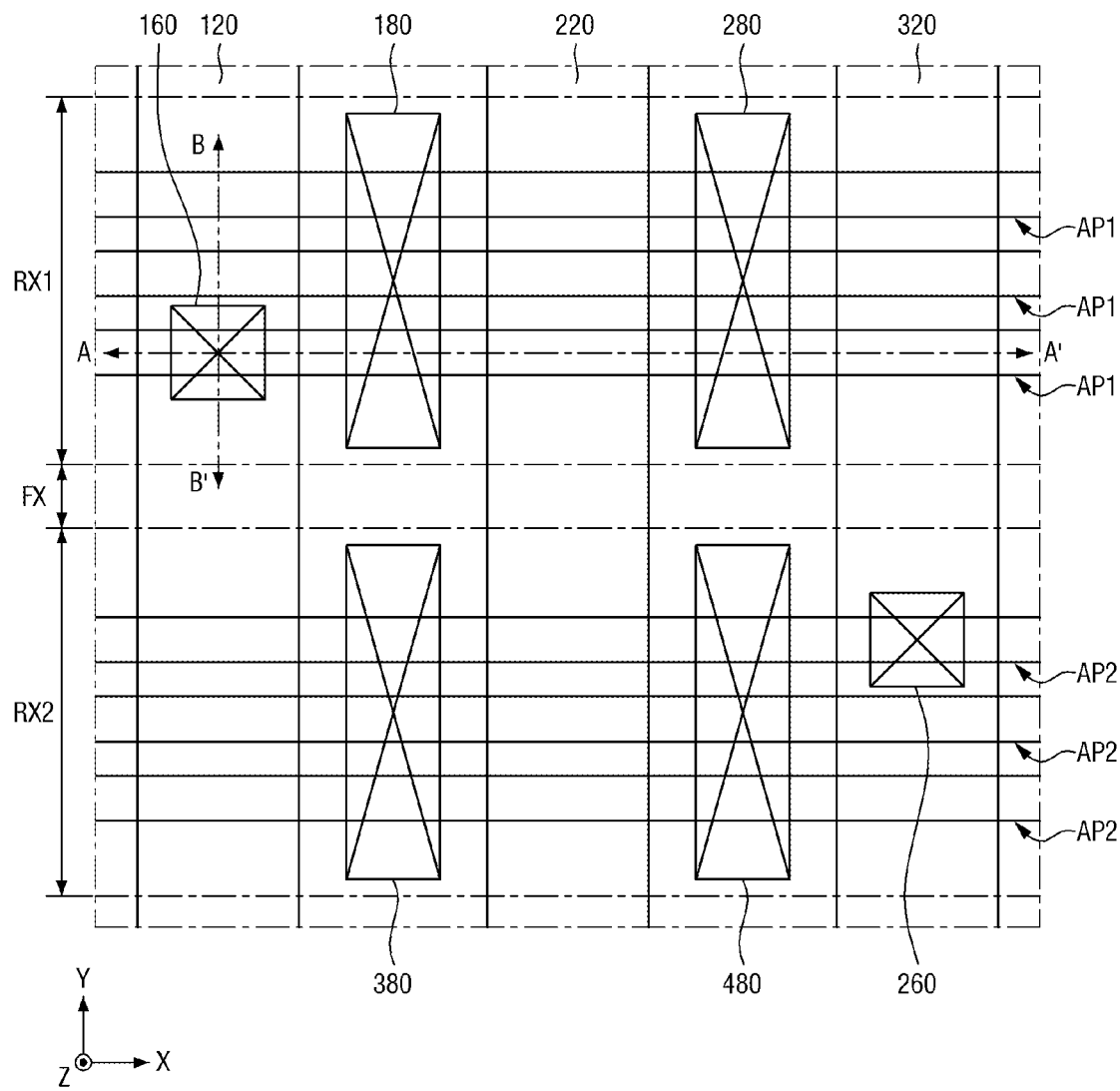
FIG. 1 is an exemplary layout diagram of a semiconductor device according to some embodiments.
Figure 2:
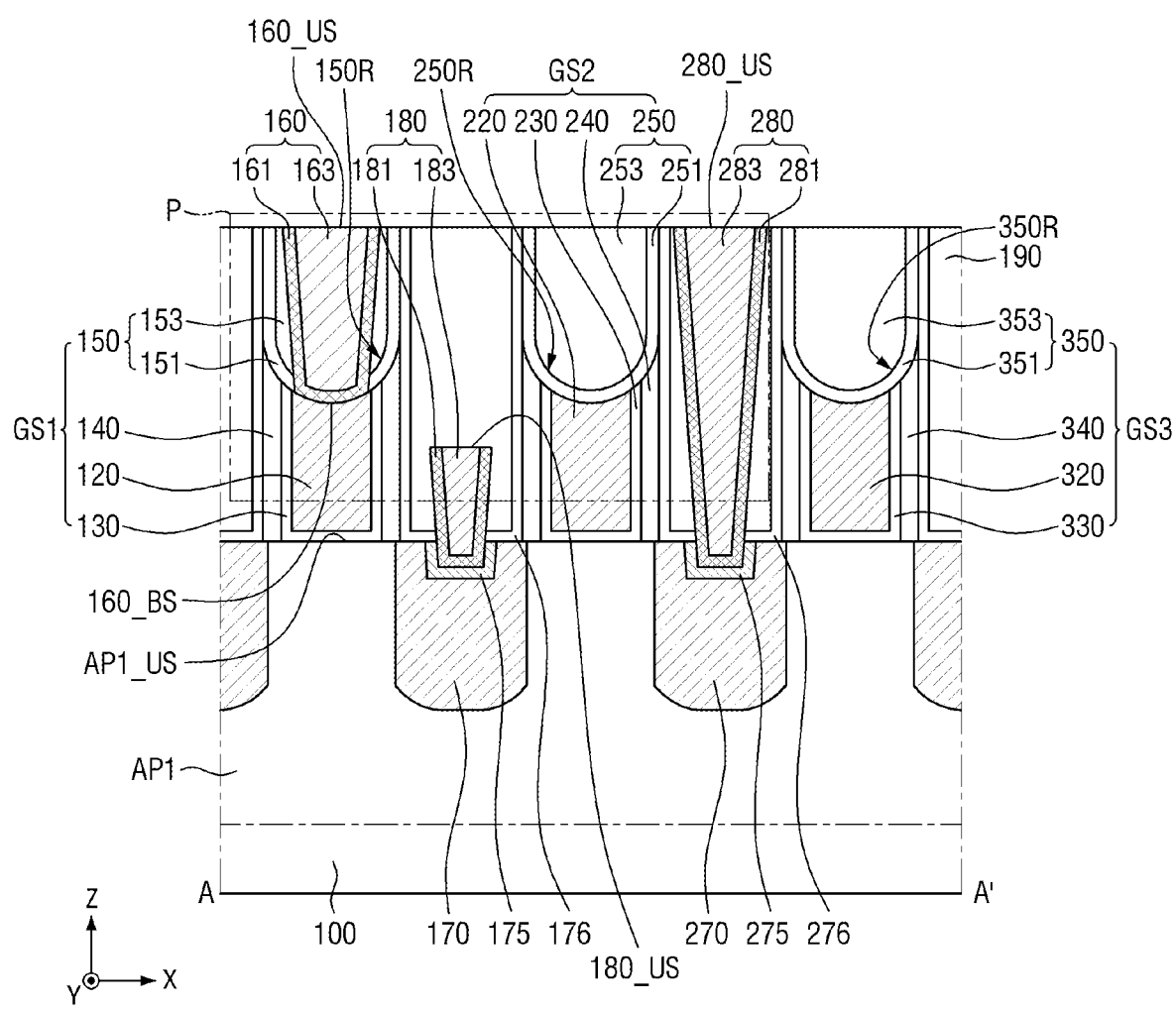
FIG. 2 is an exemplary cross-sectional view taken along line A-A' of FIG. 1.

FIG. 1 is an exemplary layout diagram of a semiconductor device according to some embodiments. FIG. 2 is an exemplary cross-sectional view along line A-A' of FIG. 1, and FIG. 3 is an exemplary cross-sectional view along line B-B' of FIG. 1.

Figure 3:
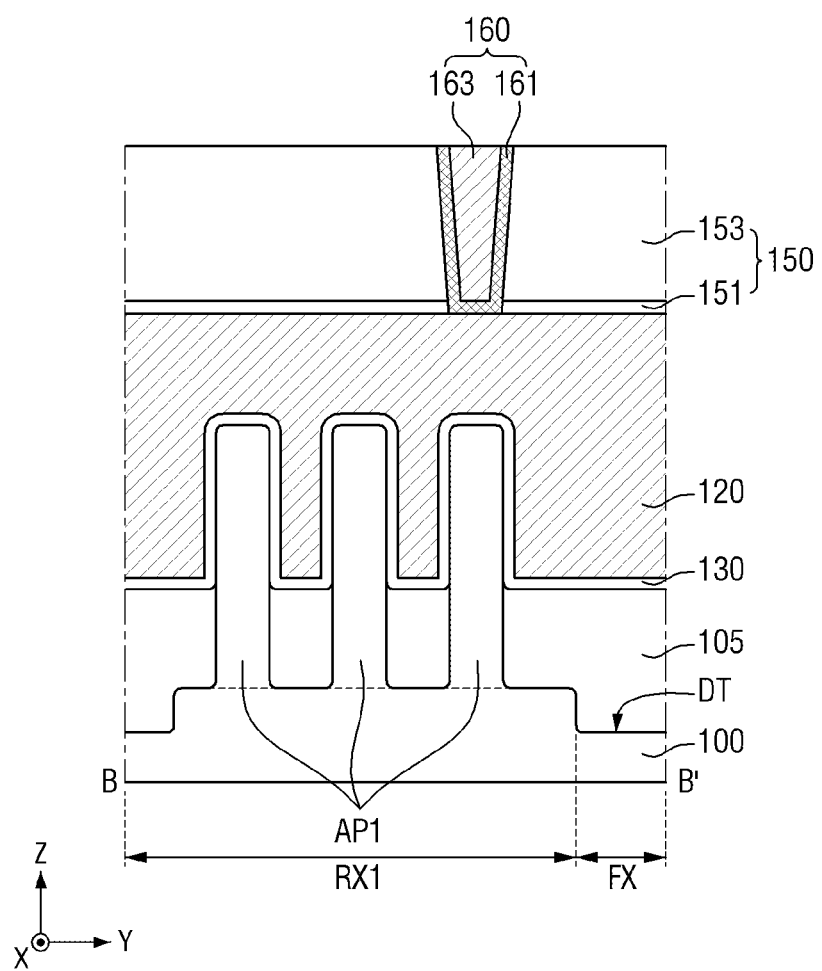
FIG. 3 is an exemplary cross-sectional view taken along line B-B' of FIG. 1.

Referring to FIGS. 1 to 3, a semiconductor device according to some embodiments may include at least one or more first active patterns AP1, at least one or more second active patterns AP2, first to third gate electrodes 120, 220 and 320, a first active contact 180, a second active contact 280, and a gate contact 160 on a substrate 100.

The substrate 100 may include a first active region RX1, a second active region RX2, and a field region FX, as illustrated in FIG. 1. The field region FX may be formed immediately adjacent to the first active region RX1 and the second active region RX2. The field region FX may form a boundary between the first active region RX1 and the second active region RX2.

The first active region RX1 and the second active region RX2 are spaced apart from each other, e.g., along a second direction Y. The first active region RX1 and the second active region RX2 may be separated by the field region FX.

In other words, an element separation film may be placed around the first active region RX1 and the second active region RX2 which are spaced apart from each other. At this time, in the element separation film, a portion between the first active region RX1 and the second active region RX2 may be the field region FX. For example, a first portion, in which a channel region of the transistor (which may be an example of the semiconductor device) is formed, may be the active region, and a second portion that divides the channel region of the transistor may be the field region. In another example, the active region may be a portion in which the fin-type pattern or nanosheet used as the channel region of the transistor is formed, and the field region may be a region in which the fin-type pattern or nanosheet is not formed. For example, as shown in FIG. 3, the field region FX may be defined by a deep trench DT.

In some embodiments, one of the first active region RX1 and the second active region RX2 may be a PMOS formation region, and the other thereof may be an NMOS formation region. In another embodiment, the first active region RX1 and the second active region RX2 may be the PMOS formation region. In yet another embodiment, the first active region RX1 and the second active region RX2 may be the PMOS formation region.

For example, the substrate 100 may be a silicon substrate or an SOI (silicon-on-insulator) substrate. In another example, the substrate 100 may further include silicon germanium, SGOI (silicon germanium on insulator), indium antimonide, lead tellurium compounds, indium arsenic, indium phosphide, gallium arsenide or gallium antimonide.

At least one or more first active patterns AP1 may be formed in the first active region RX1. The first active pattern AP1 may protrude from the substrate 100 of the first active region RX1. The first active pattern AP1 may extend long, e.g., lengthwise, along the first direction X on the substrate 100. For example, the first active pattern AP1 may include a long side extending in the first direction X, and a short side extending in the second direction Y. Here, the first direction X may intersect the second direction Y and a third direction Z. Also, the second direction Y may intersect the third direction Z.

At least one or more second active patterns AP2 may be formed in the second active region RX2. Description of the second active pattern AP2 may be substantially the same as that of the first active pattern AP1.

The first active pattern AP1 and the second active pattern AP2 may each be multi-channel active patterns. In the semiconductor device according to some embodiments, each of the first active pattern AP1 and the second active pattern AP2 may be, e.g., a fin-type pattern. Each of the first active pattern AP1 and the second active pattern AP2 may be used as a channel pattern of the transistor. Although each of the number of the first active patterns AP1 and the second active patterns AP2 is shown as three in the figures, any suitable number of each of the first and second active patterns AP1 and AP2 may be used. Each of the number of the first active patterns AP1 and the second active patterns AP2 may be one or more.

Each of the first active pattern AP1 and the second active pattern AP2 may be a part of the substrate 100, and may include an epitaxial layer that is grown from the substrate 100. The first active pattern AP1 and the second active pattern AP2 may include, e.g., silicon and germanium which is an elemental semiconductor material. Further, the first active pattern AP1 and the second active pattern AP2 may include a compound semiconductor, e.g., a group IV-IV compound semiconductor or a group III-V compound semiconductor.

For example, the group IV-IV compound semiconductor may include a binary compound or a ternary compound containing at least two or more of, e.g., carbon (C), silicon (Si), germanium (Ge), and tin (Sn), or a compound obtained by doping these elements with a group IV element. For example, the group compound semiconductor may be at least one of a binary compound, a ternary compound or a quaternary compound formed by combining at least one of, e.g., aluminum (Al), gallium (Ga) and indium (In) as a group III element with one of phosphorus (P), arsenic (As) and antimony (Sb) as a group V element.

In some embodiments, the first active pattern AP1 and the second active pattern AP2 may include the same material. In other embodiments, the first active pattern AP1 and the second active pattern AP2 may include materials different from each other.

As illustrated in FIG. 3, a field insulating film 105 may be formed on the substrate 100. The field insulating film 105 may be formed over the first active region RX1, the second active region RX2, and the field region FX. The field insulating film 105 may fill the deep trench DT.

The field insulating film 105 may be partially formed on side walls of the first active pattern AP1 and side walls of the second active pattern AP2. Each of the first active pattern AP1 and the second active pattern AP2 may protrude upward from, e.g., above, the upper surface of the field insulating film 105. The field insulating film 105 may include, e.g., an oxide film, a nitride film, an oxynitride film or a combination film thereof.

As illustrated in FIG. 2, first to third gate structures GS1, GS2 and GS3 may be placed on the substrate 100. The first to third gate structures GS1, GS2 and GS3 may extend in the second direction Y (into the page of FIG. 2). The first gate structure GS1, the second gate structure GS2, and the third gate structure GS3 may be spaced apart from each other in the first direction X. The second gate structure GS2 may be placed between the first gate structure GS1 and the third gate structure GS3. Since the second gate structure GS2 and the third gate structure GS3 may be substantially the same as the first gate structure GS1, only the first gate structure GS1 will be explained below.

The first gate structure GS1 may be placed on the first active pattern AP1 and the second active pattern AP2. The first gate structure GS1 may intersect the first active pattern AP1 and the second active pattern AP2.

Although the first gate structure GS1 is shown as being placed over the first active region RX1 and the second active region RX2, this is merely for convenience of explanation, and the embodiment is not limited thereto. That is, a part of the first gate structure GS1 is divided into two parts by a gate separation structure placed on the field insulating film 105, and may be placed on the first active region RX1 and the second active region RX2.

The first gate structure GS1 may include, e.g., a first gate electrode 120, a first gate insulating film 130, a first gate spacer 140, and a first gate capping pattern 150. The second gate structure GS2 may include, e.g., a second gate electrode 220, a second gate insulating film 230, a second gate spacer 240, and a second gate capping pattern 250. The third gate structure GS3 may include, e.g., a third gate electrode 320, a third gate insulating film 330, a third gate spacer 340, and a third gate capping pattern 350.

Since the second gate electrode 220 and the third gate electrode 320 are substantially the same as the first gate electrode 120, only the first gate electrode 120 will be described below. Since the second gate insulating film 230 and the third gate insulating film 330 are substantially the same as the first gate insulating film 130, only the first gate insulating film 130 will be described below. Since the second gate spacer 240 and the third gate spacer 340 are substantially the same as the first gate spacer 140, only the first gate spacer 140 will be described below. Since the second gate capping pattern 250 and the third gate capping pattern 350 are substantially the same as the first gate capping pattern 150, only the first gate capping pattern 150 will be described below.

The first gate electrode 120 may be formed on the first active pattern AP1 and the second active pattern AP2. The first gate electrode 120 may intersect the first active pattern AP1 and the second active pattern AP2. The first gate electrode 120 may wrap the first active pattern AP1 and the second active pattern AP2 that protrude upward from the upper surface of the field insulating film 105. The first gate electrode 120 may include a long side extending in the second direction Y, and a short side extending in the first direction X.

The first gate electrode 120 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The first gate electrode 120 may include a conductive metal oxide, a conductive metal oxynitride, and the like, and may also include an oxidized form of the above-mentioned materials.

The first gate spacer 140 may be placed on the side walls of the first gate electrode 120. The first gate spacer 140 may extend in the second direction Y. The first gate spacer 140 may include, e.g., at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The first gate insulating film 130 may extend along the side walls and the lower surface of the first gate electrode 120. The first gate insulating film 130 may be formed on the first active pattern AP1, the second active pattern AP2, and the field insulating film 105. The first gate insulating film 130 may be formed between the first gate electrode 120 and the first gate spacer 140.

The first gate insulating film 130 may be formed along a profile of the first active pattern AP1 protruding upward from the field insulating film 105 and the upper surface of the field insulating film 105. Although not shown, an interfacial film may be further formed along the profile of the first active pattern AP1 protruding upward from the field insulating film 105. The first gate insulating film 130 may be formed on the interfacial film. Although not shown, the first gate insulating film 130 may be formed along the profile of the second active pattern AP2 protruding upward from the field insulating film 105.

The first gate insulating film 130 may include, e.g., at least one of silicon oxide, silicon oxynitride, silicon nitride or a high dielectric constant material having a higher dielectric constant than silicon oxide. The high dielectric constant material may include, e.g., one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some other embodiments may include an NC (Negative Capacitance) FET using a negative capacitor. For example, the first gate insulating film 130 may include a ferroelectric material film having ferroelectric properties, and a paraelectric material film having the paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the entire capacitance values of the ferroelectric material film and the paraelectric material film connected in series may increase. Taking advantage of the increased overall capacitance value, a transistor including the ferroelectric material film may have a subthreshold swing (SS) below 60 mV/decade at room temperature.

The ferroelectric material film may have ferroelectric properties. The ferroelectric material film may include, e.g., at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, e.g., at least one of gadolinium (Gd), silicon (Si), zirconium (Zr), aluminum (Al), and yttrium (Y). When the dopant is aluminum (Al), the ferroelectric material film may include 3 at % (atomic %) to 8 at % aluminum. Here, a ratio of the dopant may be a ratio of aluminum to the sum of hafnium and aluminum.

When the dopant is silicon (Si), the ferroelectric material film may include 2 at % to 10 at % silicon. When the dopant is yttrium (Y), the ferroelectric material film may include 2 at % to 10 at % yttrium. When the dopant is gadolinium (Gd), the ferroelectric material film may include 1 at % to 7 at % gadolinium. When the dopant is zirconium (Zr), the ferroelectric material film may include 50 at % to 80 at % zirconium.

The paraelectric material film may have paraelectric properties. The paraelectric material film may include at least one of, e.g., a silicon oxide and a metal oxide having a high dielectric constant. The metal oxide included in the paraelectric material film may include, e.g., at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, e.g., 0.5 nm to 10 nm. Since a critical thickness that exhibits the ferroelectric properties may vary for each ferroelectric material, the thickness of the ferroelectric material film may vary depending on the ferroelectric material.

In some embodiments, the first gate insulating film 130 may include one ferroelectric material film. In another embodiment, the first gate insulating film 130 may include a plurality of ferroelectric material films spaced apart from each other. The first gate insulating film 130 may have a stacked film structures in which a plurality of ferroelectric material films and a plurality of paraelectric material films are alternately stacked.

The first gate capping pattern 150 may be placed on the upper surface of the first gate electrode 120 and the upper surface of the first gate spacer 140. The first gate capping pattern 150 may be formed inside a first gate capping recess 150R. The first gate capping pattern 150 may include a first gate capping liner 151 and a first gate capping filling film 153.

The first gate capping liner 151 may define the first gate capping recess 150R. The first gate capping liner 151 may be formed along the profile of the first gate capping recess 150R. The first gate capping liner 151 may extend along the upper surface of the first gate electrode 120. The first gate capping liner 151 may extend along the upper surface of the first gate spacer 140. The first gate capping liner 151 may include, e.g., at least one of aluminum oxide (AlO), aluminum nitride (AlN), silicon oxycarbide (SiOC), and a combination thereof.

The first gate capping filling film 153 may be placed on the first gate capping liner 151, e.g., the first gate capping liner 151 may be between the first gate capping filling film 153 and the first gate electrode 120. The first gate capping filling film 153 may fill the first gate capping recess 150R. The first gate capping filling film 153 may include, e.g., at least one of silicon nitride (SiN), silicon oxynitride (SiON), silicon oxide (SiO$_2$), silicon carbonitride (SiCN), silicon oxycarbonitride (SiOCN), and combinations thereof.

A first epitaxial pattern 170 and a second epitaxial pattern 270 may be formed on the first active pattern AP1. The first epitaxial pattern 170 and the second epitaxial pattern 270 may be located on the substrate 100. The first epitaxial pattern 170 may be placed between the first gate structure GS1 and the second gate structure GS2. The second epitaxial pattern 270 may be placed between the second gate structure GS2 and the third gate structure GS3.

The first and second epitaxial patterns 170 and 270 may be source/drain regions. That is, the first and second epitaxial patterns 170 and 270 may be included in the source/drain region of the transistor that uses the first active pattern AP1 as a channel region.

A first etching stop film 176 may be placed on the side wall of the first gate structure GS1, the side wall of the second gate structure GS2, and the upper surface of the first epitaxial pattern 170. The first etching stop film 176 may include a material having an etching selectivity with respect to an interlayer insulating film 190 to be described below. The first etching stop film 176 may include, e.g., at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

A second etching stop film 276 may be placed on the side wall of the second gate structure GS2, the side wall of the third gate structure GS3, and the upper surface of the second epitaxial pattern 270. The second etching stop film 276 may include, e.g., at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The interlayer insulating film 190 may be placed on the first epitaxial pattern 170 and the second epitaxial pattern 270. The interlayer insulating film 190 may not cover the upper surfaces of the first gate capping pattern 150, the second gate capping pattern 250, and the third gate capping pattern 350. For example, the upper surface of the interlayer insulating film 190 may be placed on the same plane as the upper surfaces of the first gate capping pattern 150, the second gate capping pattern 250, and the third gate capping pattern 350.

The interlayer insulating film 190 may include, e.g., at least one of silicon oxide, silicon nitride, silicon oxynitride, and a low dielectric constant material. The low dielectric constant material may include, e.g., Fluorinated TetraEthyl-OrthoSilicate (FTEOS), Hydrogen SilsesQuioxane (HSQ), Bis-benzoCycloButene (BCB), TetraMethylOrthoSilicate (TMOS), OctaMethylcyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first active contact 180 and the second active contact 280 may be placed on the first active region RX1. A third active contact 380 and a fourth active contact 480 may be placed on the second active region RX2.

The first active contact 180 may be connected to the first epitaxial pattern 170 formed in the first active region RX1. The second active contact 280 may be connected to the second epitaxial pattern 270 formed in the first active region RX1. Although not shown, the third active contact 380 and the fourth active contact 480 may be connected to a source/drain region formed in the second active region RX2. Since the third active contact 380 and the fourth active contact 480 are substantially the same as the first active contact 180 and the second active contact 280, only the first and second active contacts 180 and 280 will be described below.

The gate contact 160 may be placed inside the first gate structure GS1. The gate contact 160 may be connected to the first gate electrode 120. The gate contact 160 may be placed at a position where it overlaps the first gate structure GS1. In some embodiments, at least a part of the gate contact 160 may be placed at a position where it overlaps the first active pattern AP1.

The gate contact 160 may include a gate barrier film 161, and a gate filling film 163 on the gate barrier film 161. The gate barrier film 161 may extend along the side walls and the lower surface of the gate filling film 163. Although a lower surface 160_BS of the gate contact 160 is shown to have a wavy shape, the embodiment is not limited thereto.

The gate barrier film 161 may include, e.g., at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. In the semiconductor device according to some embodiments, the two-dimensional material may be a metallic material and/or a semiconductor material. The two-dimensional (2D material) may include a two-dimensional allotrope or a two-dimensional compound, and may include, but is not limited to, e.g., at least one of graphene, molybdenum disulfide ($MoS_2$), molybdenum diselenide ($MoSe_2$), tungsten diselenide ($WSe_2$), tungsten disulfide ($WS_2$). That is, since the above-mentioned two-dimensional materials are only listed by way of example, the two-dimensional materials that may be included in the semiconductor device of the present disclosure are not limited by the above-mentioned materials.

The gate filling film 163 may include, e.g., at least one of aluminum (Al), tungsten (W), cobalt (Co), ruthenium (Ru), silver (Ag), gold (Au), manganese (Mn), and molybdenum (Mo).

The first active contact 180 may be connected to the first epitaxial pattern 170. The second active contact 280 may be connected to the second epitaxial pattern 270. The first active contact 180 and the second active contact 280 may be placed inside the interlayer insulating film 190. The first active contact 180 and the second active contact 280 may be surrounded by the interlayer insulating film 190.

A first silicide film 175 may be formed between the first active contact 180 and the first epitaxial pattern 170. A second silicide film 275 may be formed between the second active contact 280 and the second epitaxial pattern 270. Although the first silicide film 175 is shown as being formed along the profile of an interface between the first epitaxial pattern 170 and the first active contact 180, the embodiment is not limited thereto. Similarly, although the second silicide film 275 is shown as being formed along the profile of the interface between the second epitaxial pattern 270 and the second active contact 280, the embodiment is not limited thereto. The first silicide film 175 and the second silicide film 275 may include, e.g., a metal silicide material.

The first active contact 180 may include a first active barrier film 181, and a first active filling film 183 on the first active barrier film 181. The first active barrier film 181 may extend along the side walls and the lower surface of the first active filling film 183. The contents of the materials included in the first active barrier film 181 and the first active filling film 183 may be the same as the description of the materials included in the gate barrier film 161 and the gate filling film 163.

In terms of a cross-section, the lower surface 160_BS of the gate contact 160 is higher than an upper surface 180_US of the first active contact 180. That is, a height from the upper surface AP1_US of the first active pattern AP1 to the lower surface 160_BS of the gate contact 160 is greater than a height from the upper surface AP1_US of the first active pattern AP1 to the upper surface 180_US of the first active contact 180.

In terms of a cross-section, the upper surface 180_US of the first active contact 180 is lower than the upper surface 280_US of the second active contact 280. That is, the height from the upper surface AP1_US of the first active pattern AP1 to the upper surface 180_US of the first active contact 180 is smaller than the height from the upper surface AP1_US of the first active pattern AP1 to the upper surface 280_US of the second active contact 280.

Figure 4:
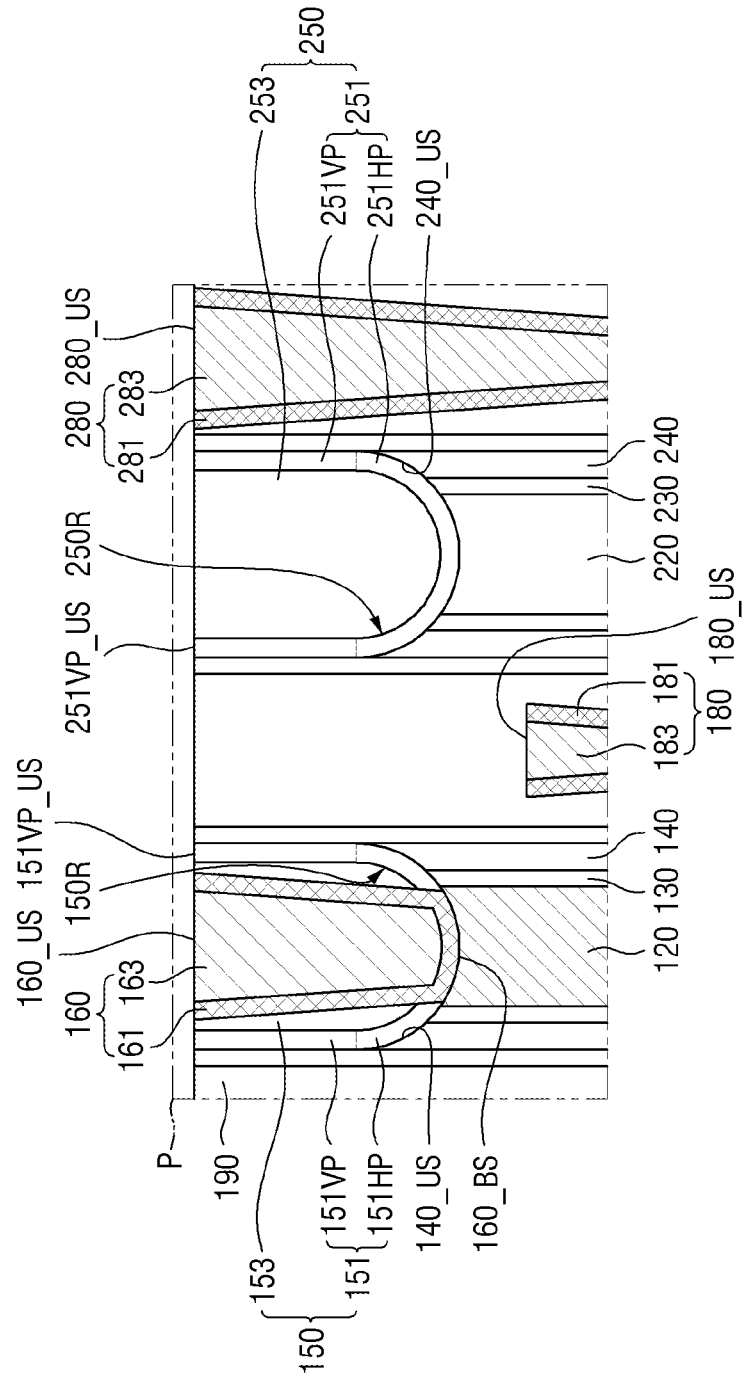
FIG. 4 is an enlarged view of portion P of FIG. 2.

FIG. 4 is an enlarged view of portion P of FIG. 2. The gate contact 160, the first gate capping pattern 150, the second gate capping pattern 250, the first active contact 180, and the second active contact 280 will be explained in detail, using FIG. 4. For convenience of explanation, only enlarged features not illustrated previously in FIGS. 1 to 3 will be mainly described.

Referring to FIG. 4, the first gate capping pattern 150 may include a first gate capping liner 151 and a first gate capping filling film 153. The second gate capping pattern 250 may include a second gate capping liner 251 and a second gate capping filling film 253. The third gate capping pattern 350 may include a third gate capping liner 351 and a third gate capping filling film 353.

The first gate capping liner 151 may define a first gate capping recess 150R. The second gate capping liner 251 may define a second gate capping recess 250R. The third gate capping liner 351 may define a third gate capping recess 350R.

The first gate capping liner 151 may be placed on a part of the side wall of the gate contact 160. The second gate capping liner 251 and the third gate capping liner 351 may be placed on parts of the side walls of the second active contact 280, e.g., the second gate capping liner 251 and the third gate capping liner 351 may be on opposite walls of the second active contact 280. The first gate capping liner 151 may extend to the upper surface 160_US of the gate contact 160. The second gate capping liner 251 and the third gate capping liner 351 may extend to the upper surface 280_US of the second active contact 280.

The first gate capping filling film 153 may fill the first gate capping recess 150R. The second gate capping filling film 253 may fill the second gate capping recess 250R. The third gate capping filling film 353 may fill the third gate capping recess 350R.

The first gate capping liner 151 may include a first horizontal portion 151HP extending along the upper surface of the first gate structure GS1, e.g., the first gate electrode 120, and a first vertical portion 151VP extending in the third direction Z from the first horizontal portion 151HP. For example, as illustrated in FIG. 4, the first horizontal portion 151HP may overlap the upper surface of the first gate electrode 120, continuously extend to overlap the upper surface of the first gate insulating film 130, and continuously extend to overlap the upper surface of first gate spacer 140. For example, referring to FIGS. 3 and 4, the first horizontal portion 151HP may directly contact the upper surface of the first gate electrode 120 around the gate contact 160.

The second gate capping liner 251 may include a second horizontal portion 251HP extending along the upper surface of the second gate electrode 220, and a second vertical portion 251VP extending from the second horizontal portion 251HP in the third direction Z.

The first horizontal portion 151HP extends along the upper surface 140_US of the first gate spacer 140. That is, at least a part of the first horizontal portion 151HP overlaps the upper surface 140_US of the first gate spacer 140 in the third direction Z.

The second horizontal portion 251HP extends along the upper surface 240_US of the second gate spacer 240. That is, at least a part of the second horizontal portion 251HP overlaps the upper surface 240_US of the second gate spacer 240 in the third direction Z.

The first vertical portion 151VP extends along the side wall of the first gate capping filling film 153. The first vertical portion 151VP may be placed on the side wall of the first gate capping filling film 153. The second vertical portion 251VP extends along the side wall of the second gate capping filling film 253. The second vertical portion 251VP may be placed on the side wall of the second gate capping filling film 253.

In some embodiments, the first vertical portion 151VP may extend to the upper surface 160_US of the gate contact 160. The second vertical portion 251VP may extend to the upper surface 280_US of the second active contact 280.

The upper surface 151VP_US of the first vertical portion 151VP may be placed on the same plane as the upper surface 160_US of the gate contact 160, e.g., may be level with each other. The upper surface 251VP_US of the second vertical portion 251VP may be placed on the same plane as the upper surface 280_US of the second active contact 280, e.g., may be level with each other.

The gate contact 160 may be formed to penetrate through the first gate capping pattern 150. The gate contact 160 may penetrate the first gate capping pattern 150 in the third direction Z. The gate contact 160 may penetrate the first gate capping pattern 150 and be connected to the first gate electrode 120.

In some embodiments, at least a part of the gate contact 160 may overlap the first active contact 180 in the first direction X in terms of a plane. At least some of the gate contacts 160 may overlap the second active contact 280 in the first direction X in terms of a plane.

In terms of a cross-section, the lower surface 160_BS of the gate contact 160 is higher than the upper surface 180_US of the first active contact 180. In terms of a cross-section, the lower surface 160_BS of the gate contact 160 is lower than the upper surface 280_US of the second active contact 280. The upper surface 160_US of the gate contact 160 may be located on the same plane as the upper surface 180_US of the first active contact 180.

Figure 5:
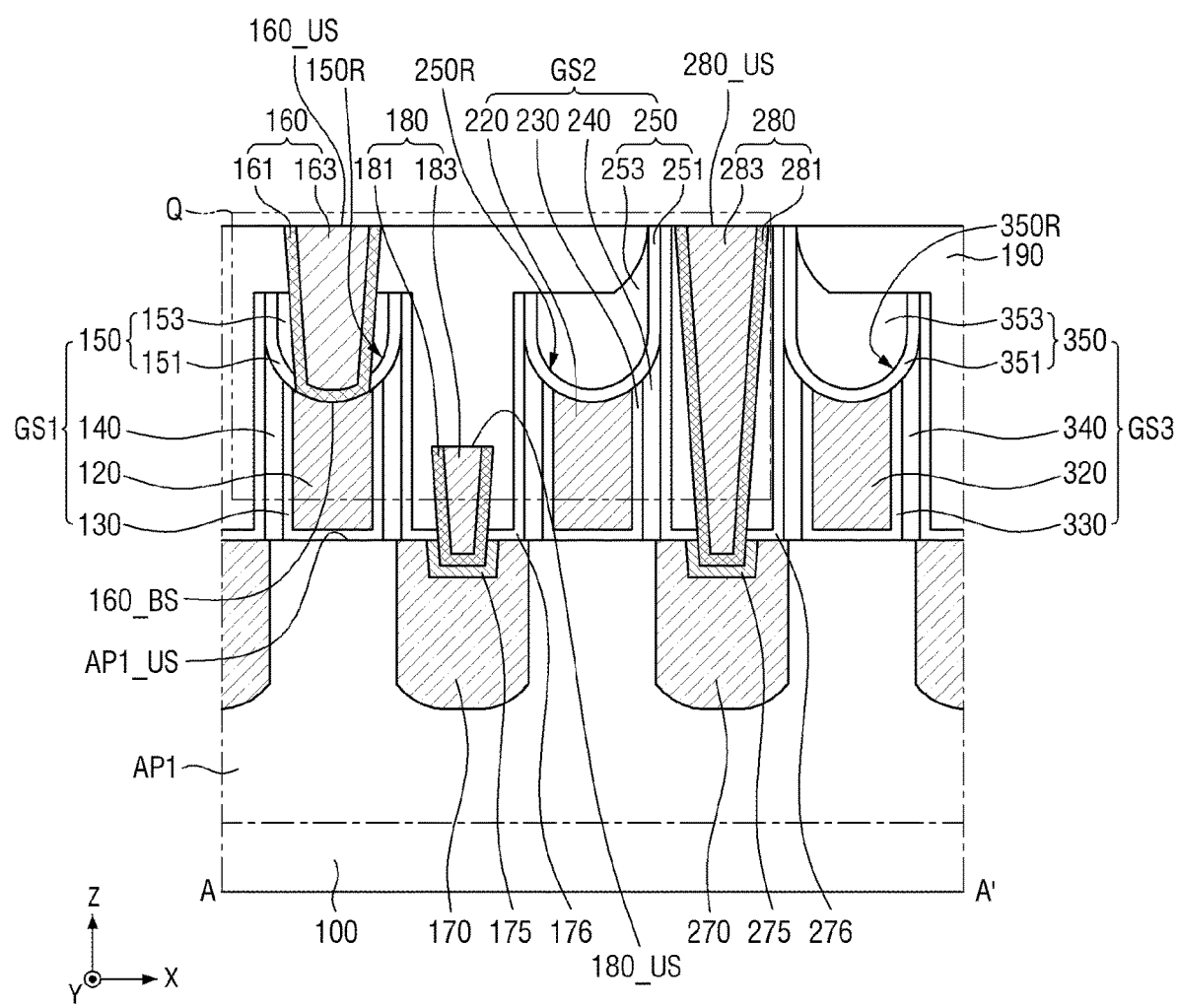
FIG. 5 is a cross-sectional view of a semiconductor device according to some embodiments.
Figure 6:
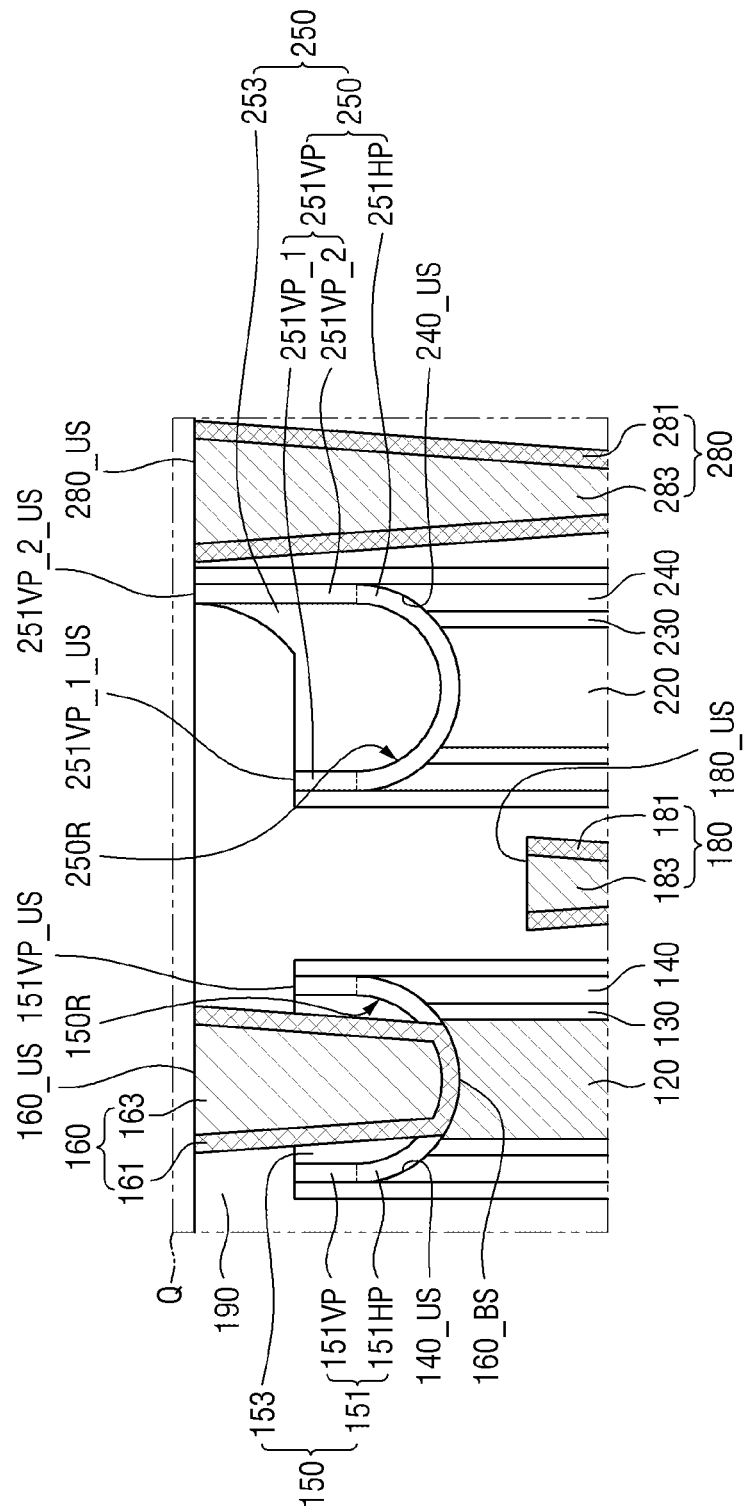
FIG. 6 is a cross-sectional view of a semiconductor device according to some embodiments.

FIG. 5 is a cross-sectional view of a semiconductor device according to some embodiments. FIG. 6 is an enlarged view of portion Q in FIG. 5. For convenience of explanation, only features different from those described previously with reference to FIGS. 1 to 4 will be described in detail.

Referring to FIG. 5, at least a part of the interlayer insulating film 190 may be placed on the first gate capping pattern 150. At least a part of the interlayer insulating film 190 may be placed on the second gate capping pattern 250. At least a part of the interlayer insulating film 190 may be placed on the third gate capping pattern 350.

That is, at least a part of the interlayer insulating film 190 may overlap the first gate capping pattern 150 in the third direction Z. At least a part of the interlayer insulating film 190 may overlap the second gate capping pattern 250 in the third direction Z. At least a part of the interlayer insulating film 190 may overlap the third gate capping pattern 350 in the third direction Z.

In some embodiments, the first gate capping liner 151 may not extend to the upper surface 160_US of the gate contact 160. The second gate capping liner 251 may not extend to the upper surface 280_US of the second active contact 280.

Referring to FIG. 6, the upper surface 151VP_US of the first vertical portion 151VP of the first gate capping liner 151 may be lower than the upper surface 160_US of the gate contact 160. That is, the gate contact 160 may protrude upward from, e.g., above, the upper surface 151VP_US of the first vertical portion 151VP. The upper surface 151VP_US of the first vertical portion 151VP is higher than the upper surface 180_US of the first active contact 180.

The second vertical portion 251VP may include a second short vertical portion 251VP_1 and a second long vertical portion 251VP_2. The second short vertical portion 251VP_1 and the second long vertical portion 251VP_2 may be spaced apart from each other in the first direction X. The second long vertical portion 251VP_2 may be placed between the second short vertical portion 251VP_1 and the side wall of the second active contact 280.

The second short vertical portion 251VP_1 may not extend to the upper surface 280_US of the second active contact 280. That is, the upper surface 251VP_1_US of the second short vertical portion 251VP_1 may be lower than the upper surface 280_US of the second active contact 280.

The second long vertical portion 251VP_2 may extend to the upper surface 280_US of the second active contact 280. That is, the upper surface 251VP_2_US of the second long vertical portion 251VP_2 and the upper surface 280_US of the second active contact 280 may be placed in the same plane, e.g., may be level with each other.

Figure 7:
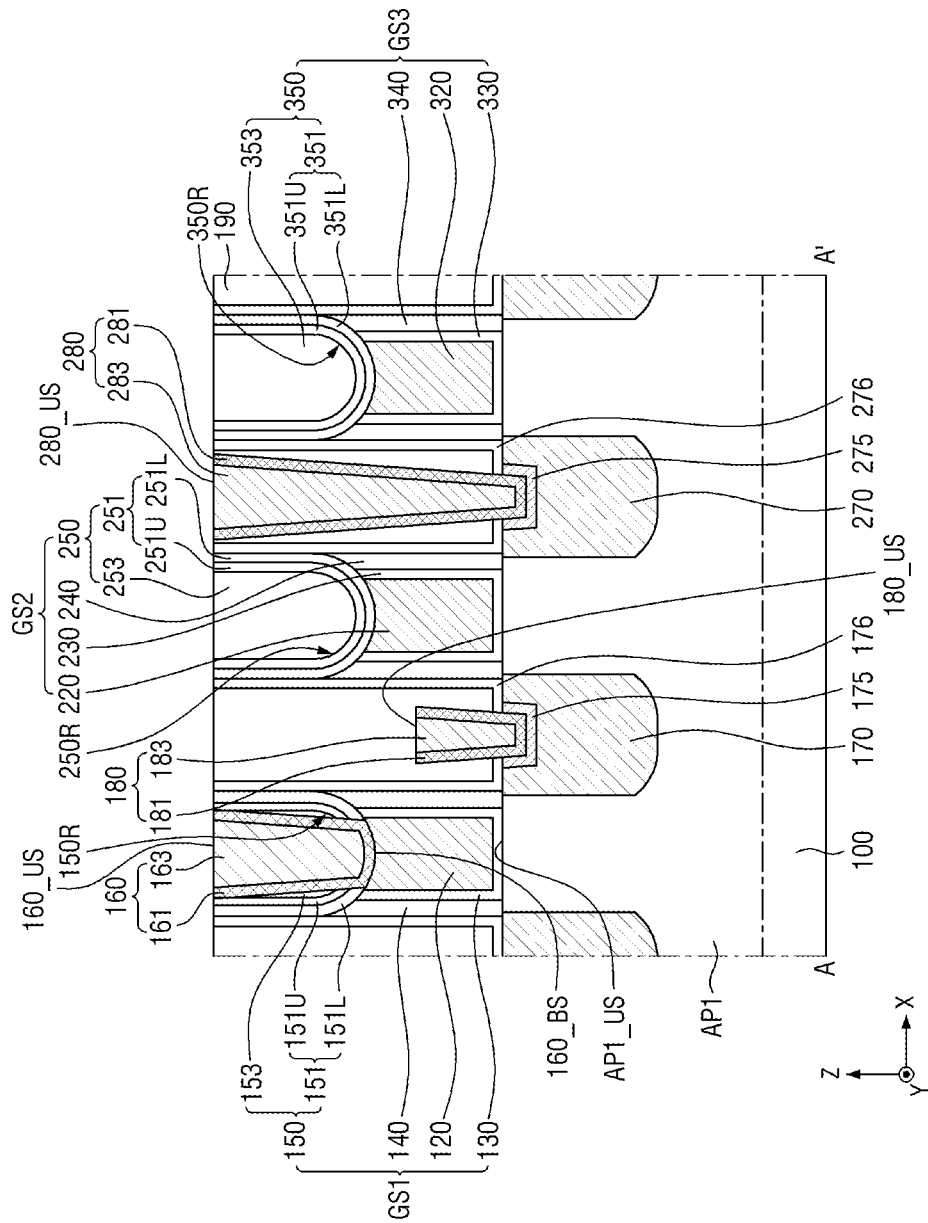
FIG. 7 is a cross-sectional view of a semiconductor device according to some embodiments.
Figure 8:
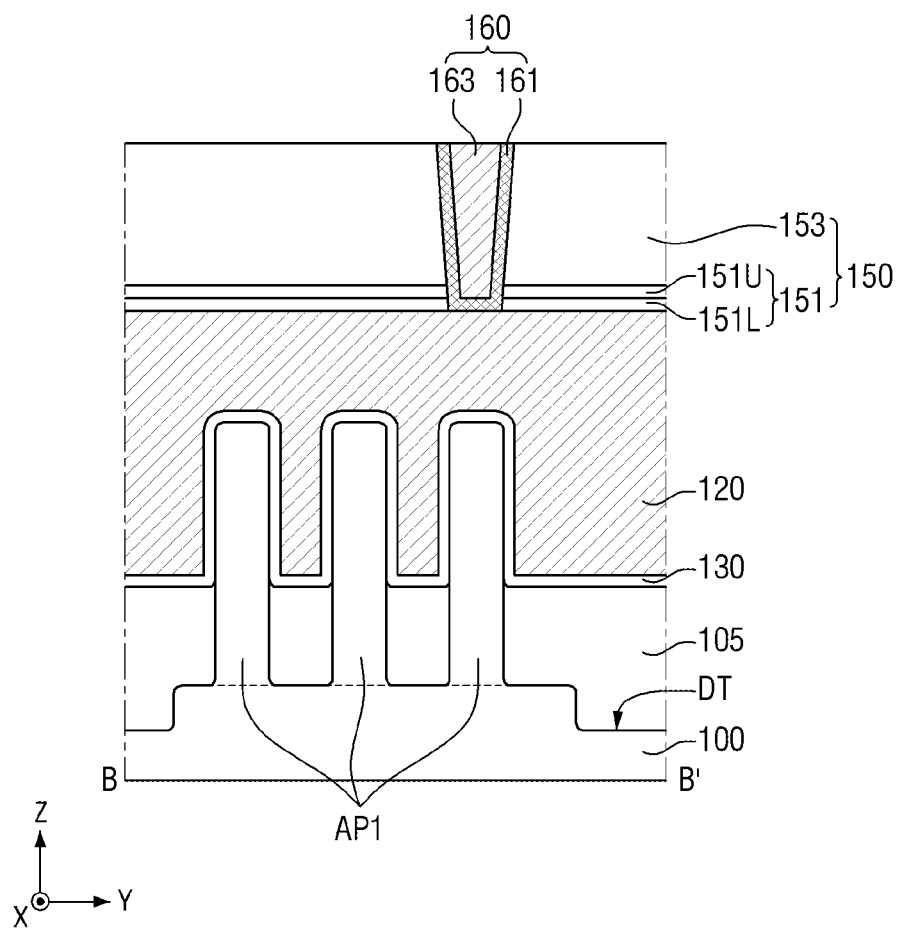
FIG. 8 is a cross-sectional view of a semiconductor device according to some embodiments.

FIG. 7 is a cross-sectional view of a semiconductor device according to some embodiments corresponding to line A-A' of FIG. 1. FIG. 8 is a cross-sectional view of a semiconductor device according to some embodiments corresponding to line B-B' of FIG. 1. For convenience of explanation, only features different from those described previously with reference to FIGS. 1 to 4 will be mainly described.

Referring to FIGS. 7 and 8, the first gate capping liner 151, the second gate capping liner 251, and the third gate capping liner 351 may each include multi-films. Since the second gate capping liner 251 and the third gate capping liner 351 may be substantially the same as the first gate capping liner 151, only the first gate capping liner 151 will be described below.

The first gate capping liner 151 may include a first lower gate capping liner 151L and a first upper gate capping liner 151U. The first upper gate capping liner 151U may be placed on the first lower gate capping liner 151L.

Etching selectivity of the first lower gate capping liner 151L and etching selectivity of the first upper gate capping liner 151U may be different from each other. The first lower gate capping liner 151L may include, e.g., at least one of aluminum oxide (AlO) and aluminum nitride (AlN). The second upper gate capping liner 151U may include, e.g., silicon oxycarbide (SiOC). Although the first gate capping liner 151 is shown as a double film, the first gate capping liner 151 may include any suitable number of films, e.g., may be a triple film.

Figure 9:
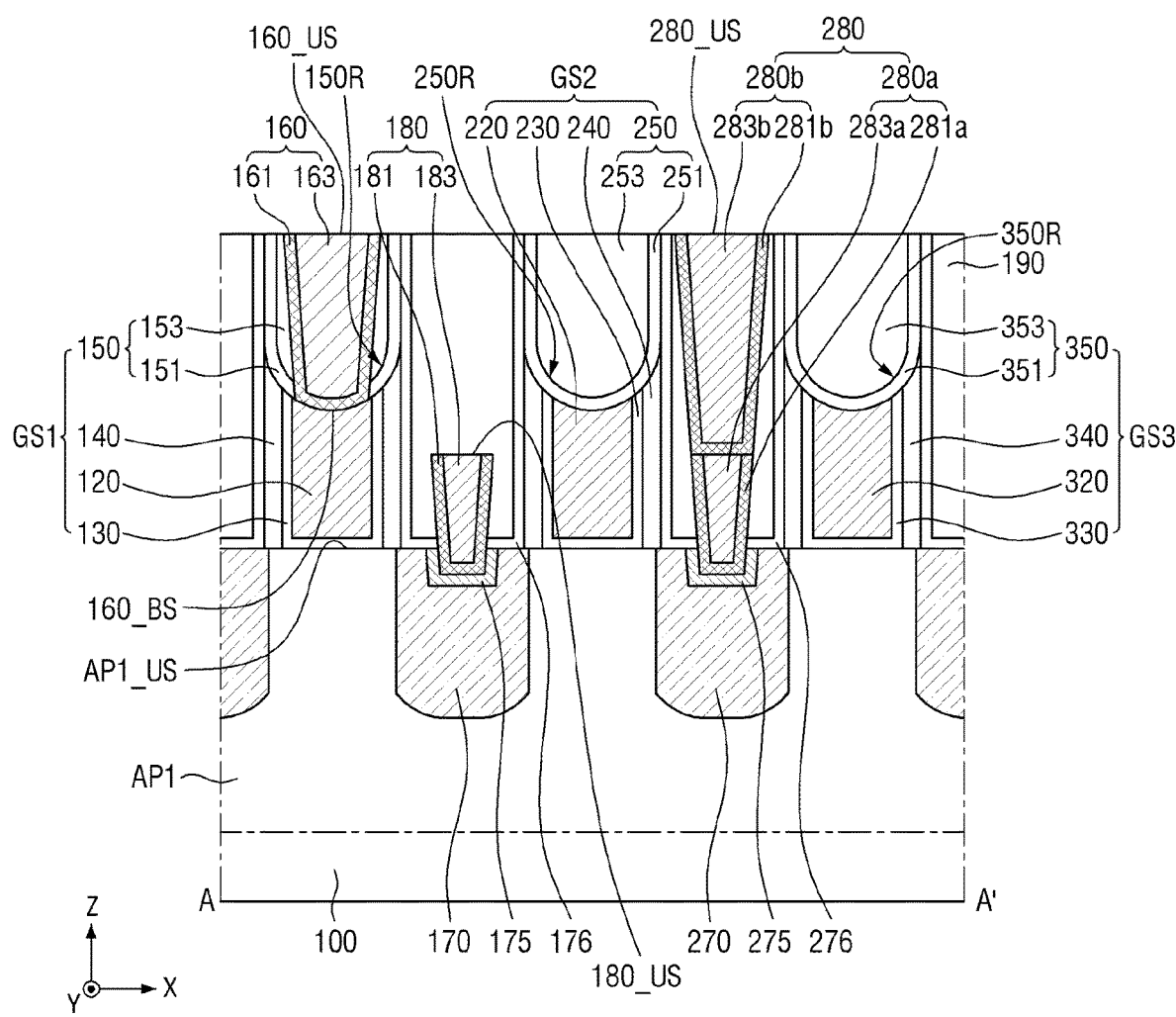
FIG. 9 is a cross-sectional view of a semiconductor device according to some embodiments.
Figure 10:
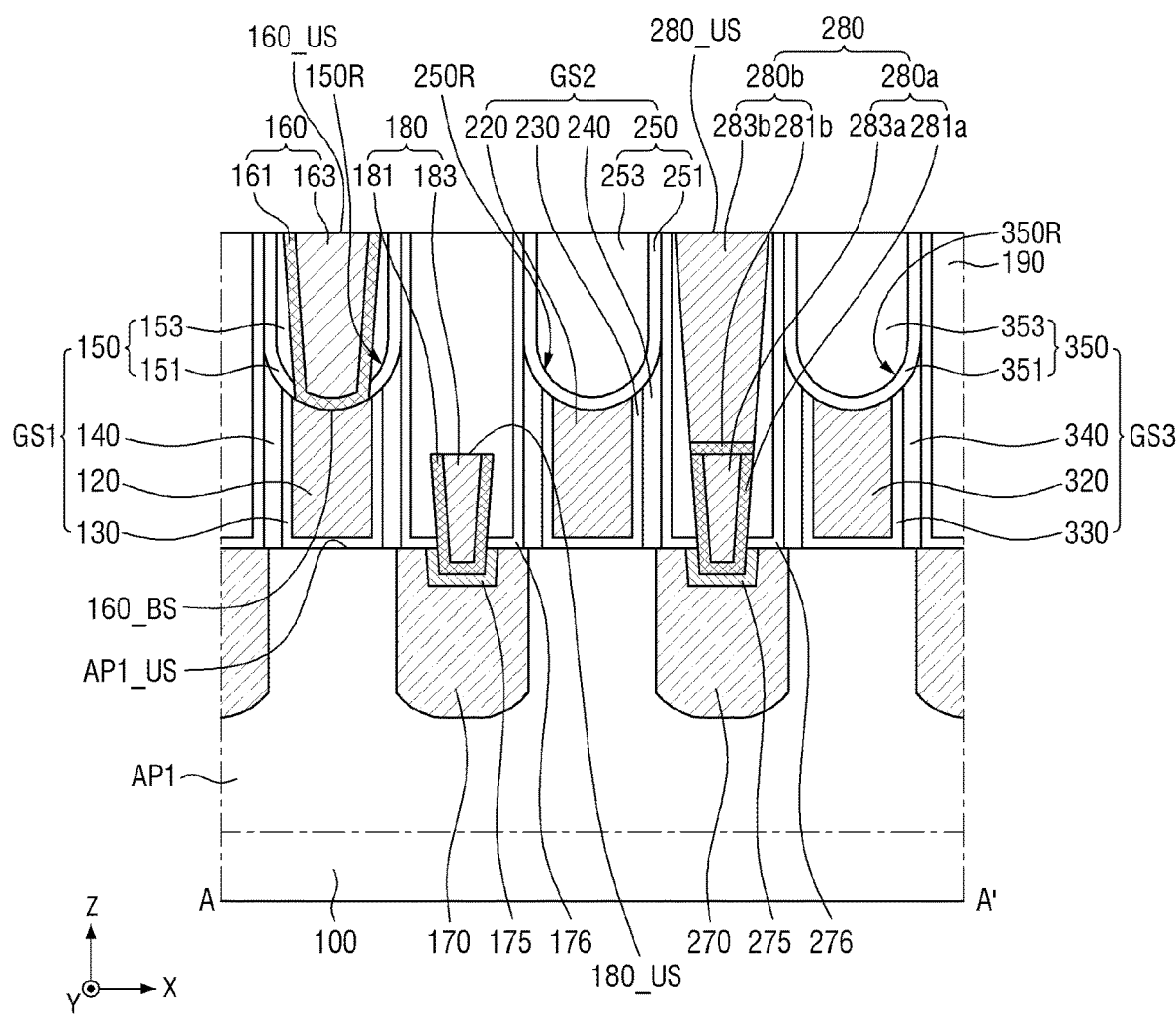
FIG. 10 is a cross-sectional view of a semiconductor device according to some embodiments.

FIG. 9 is a cross-sectional view of a semiconductor device according to some embodiments corresponding to line A-A' of FIG. 1. FIG. 10 is a cross-sectional view of a semiconductor device according to some embodiments corresponding to line A-A' of FIG. 1. For convenience of explanation, only features different from those described previously with reference to FIGS. 1 to 4 will be mainly described.

Referring to FIG. 9, in the semiconductor device according to some embodiments, the second active contact 280 may include a second lower active contact 280a and a second upper active contact 280b. The second lower active contact 280a may include a second lower active barrier film 281a and a second lower active filling film 283a. The second upper active contact 280b may include a second upper active barrier film 281b and a second upper active filling film 283b.

The upper surface 280_US of the second active contact 280 may be an upper surface of the second upper active contact 280b. The materials included in the second lower active barrier film 281a and the second upper active barrier film 281b may be the same as the description of the materials included in the gate barrier film 161. Contents of the materials included in the second lower active filling film 283a and the second upper active filling film 283b may be the same as the description of the materials included in the gate filling film 163.

Referring to FIG. 10, the second upper active barrier film 281b may not extend along the side wall of the second upper active filling film 283b. The second upper active barrier film 281b may be formed only on the lower surface of the second upper active filling film 283b.

Figure 11:
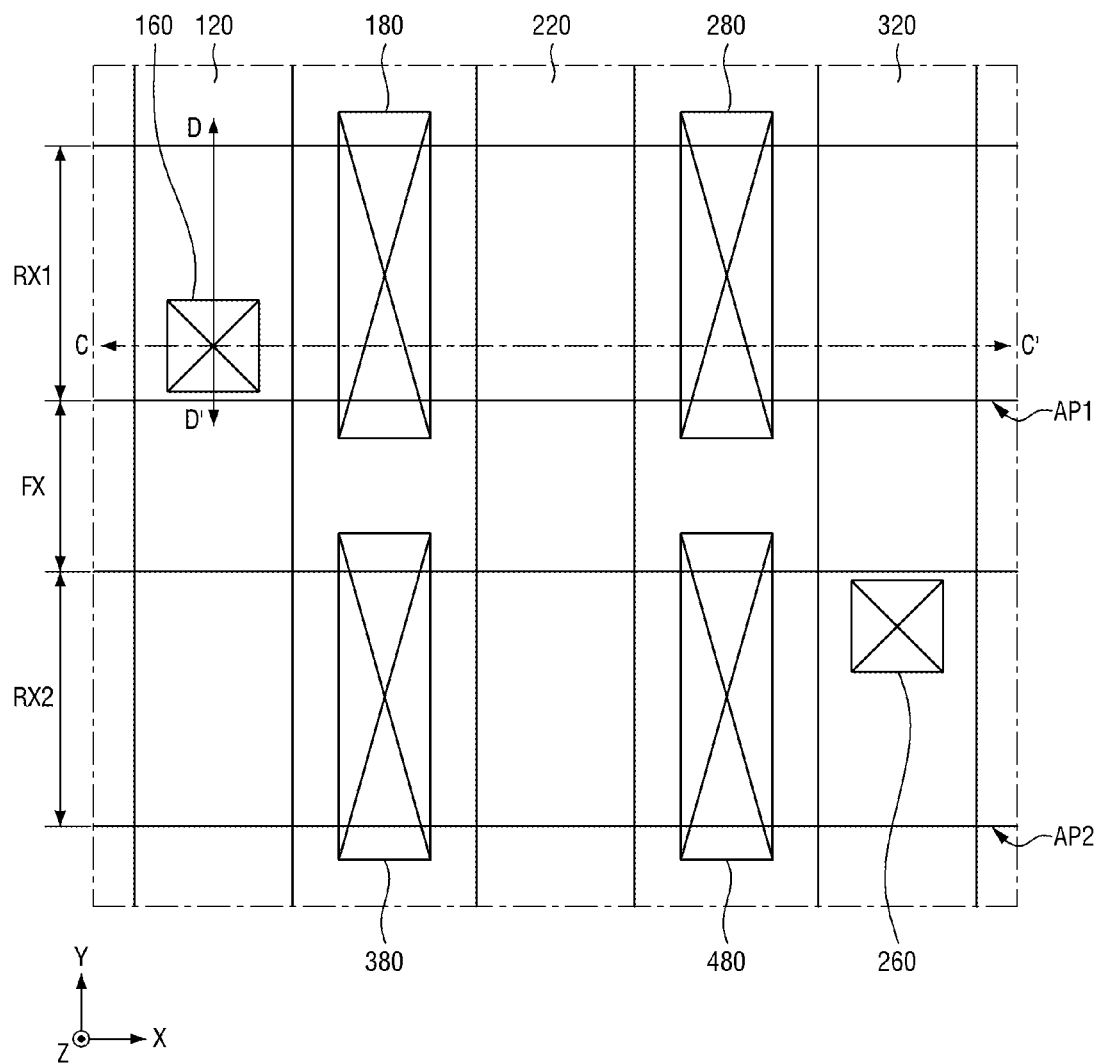
FIG. 11 is an exemplary layout diagram of a semiconductor device according to some embodiments.
Figure 12:
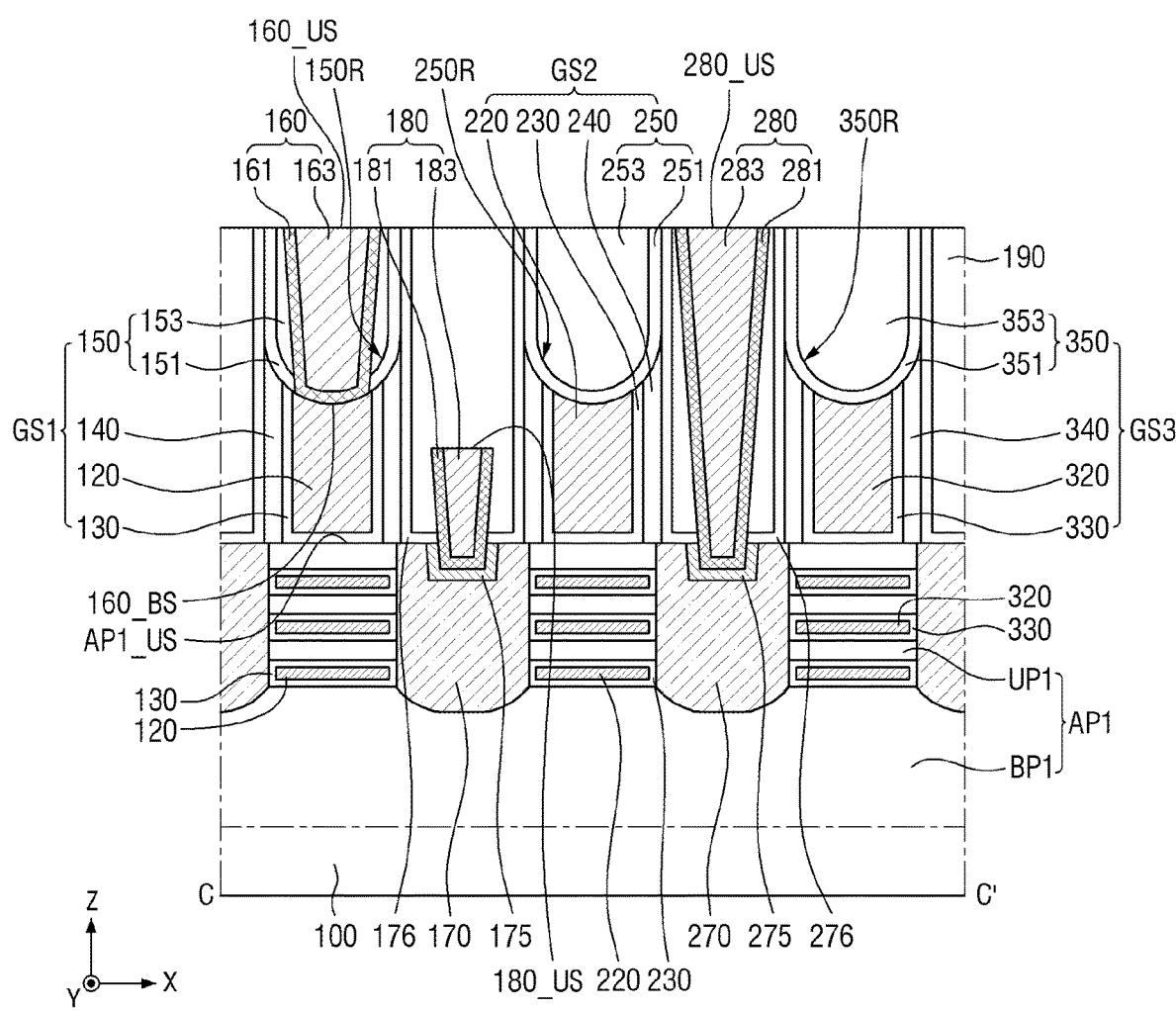
FIGS. 12 and 13 are cross-sectional views along line C-C' of FIG. 11.
Figure 13:
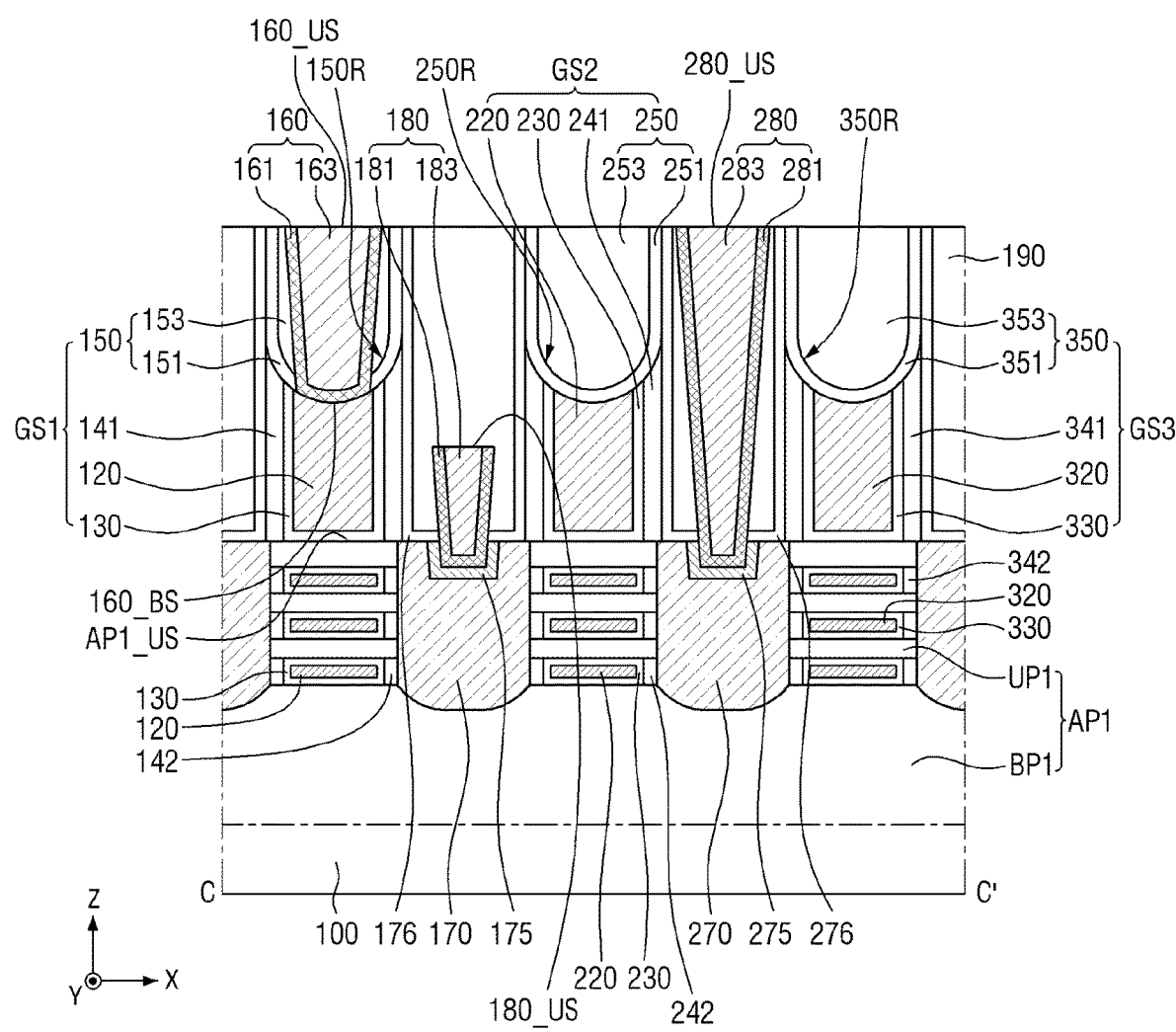
Figure 14:
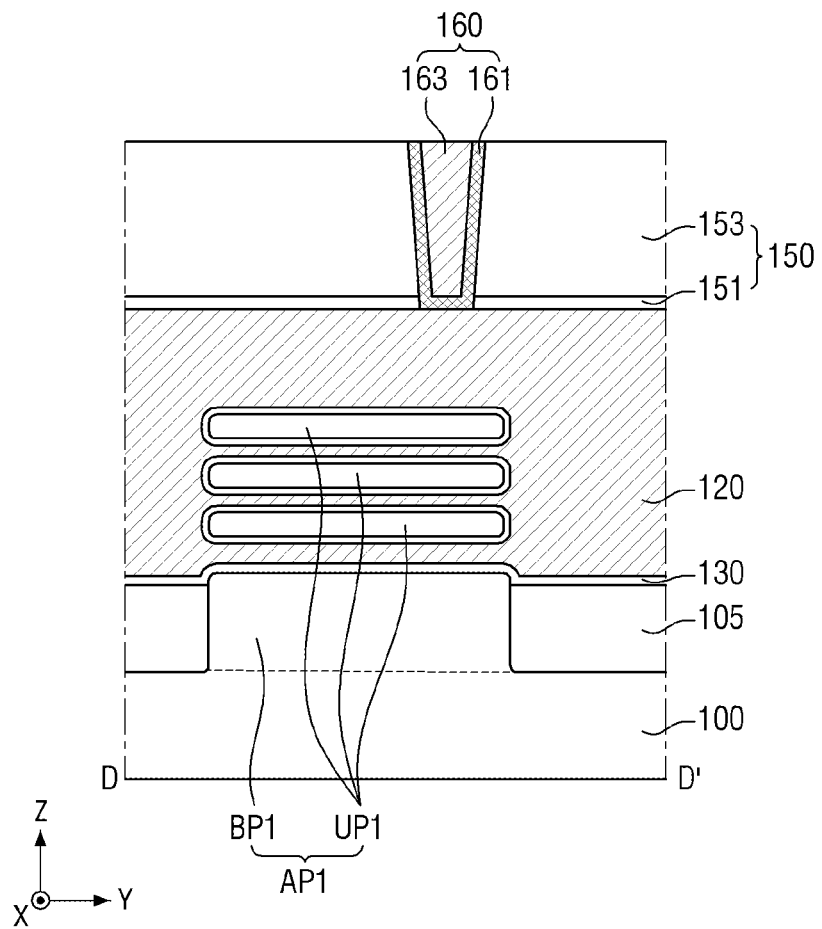
FIG. 14 is a cross-sectional view along line D-D' of FIG. 11.
Figure 15:
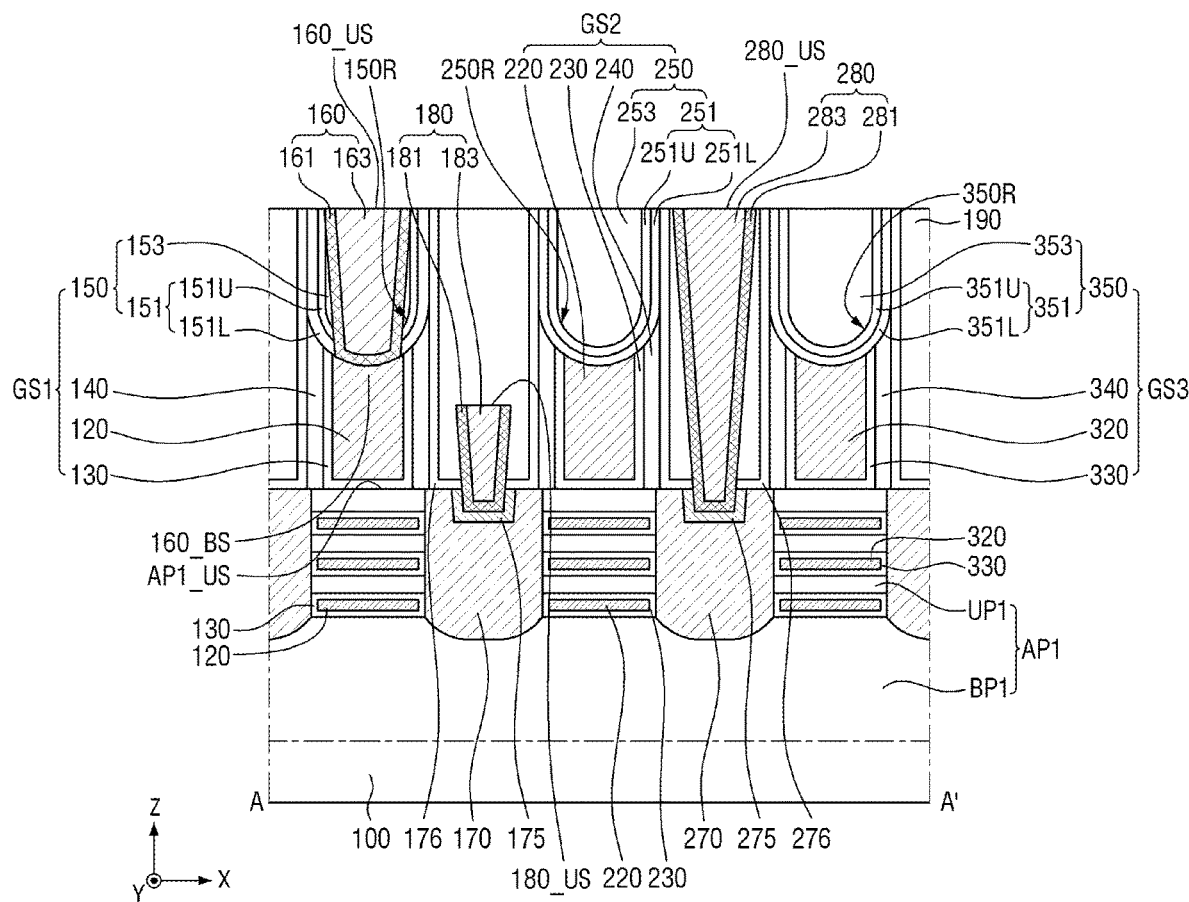
FIG. 15 is a cross-sectional view of a semiconductor device according to some embodiments.
Figure 16:
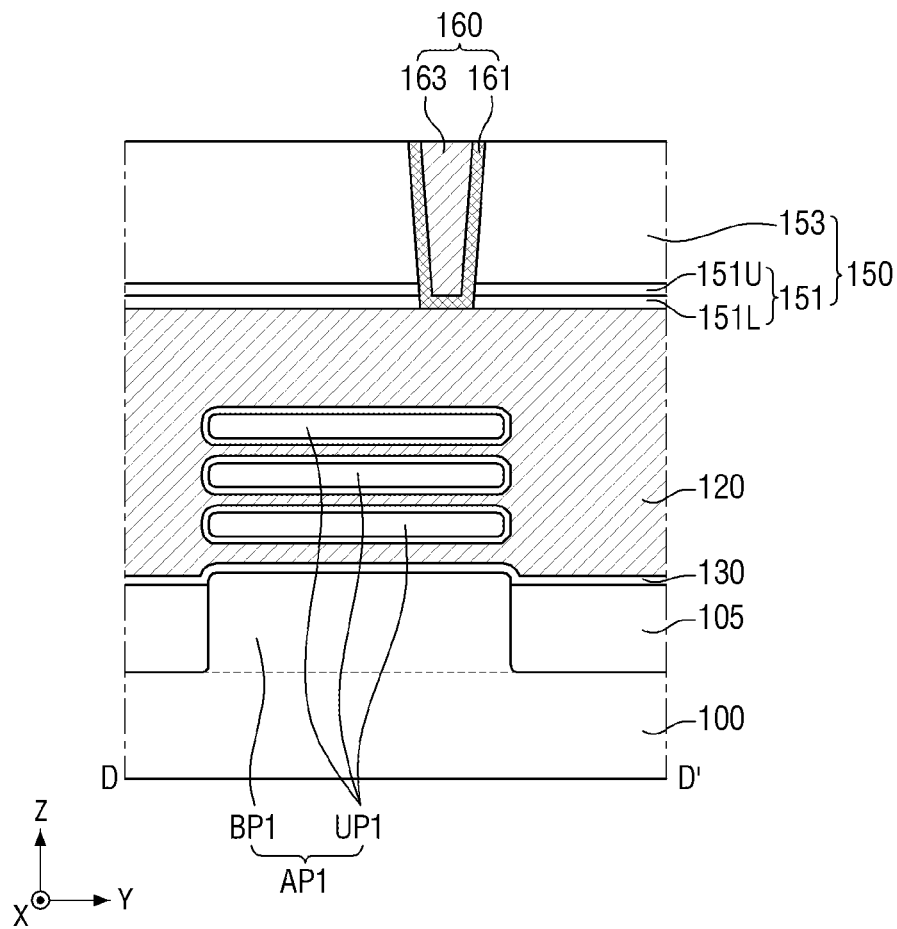
FIG. 16 is a cross-sectional view of a semiconductor device according to some embodiments.

FIG. 11 is an exemplary layout diagram of a semiconductor device according to some embodiments. FIGS. 12 and 13 are exemplary cross-sectional views taken along line C-C' of FIG. 11. FIG. 14 is an exemplary cross-sectional view taken along line D-D' of FIG. 11. FIG. 15 is a diagram for explaining the semiconductor device according to some embodiments. FIG. 16 is a diagram for explaining the semiconductor device according to some embodiments. For convenience of explanation, only features different from those described previously with reference to FIGS. 1 to 8 will be mainly described.

Referring to FIGS. 11 to 16, the first active pattern AP1 of the semiconductor device according to some embodiments may include a lower pattern BP1 and a sheet pattern UP1. Although not shown, the second active pattern AP2 may include a lower pattern and a sheet pattern.

The sheet pattern UP1 may include a plurality of sheet patterns stacked in the third direction Z. Although three sheet patterns UP1 are shown, this is merely for convenience of explanation, and the number thereof is not limited thereto.

The sheet pattern UP1 may be connected to the first epitaxial pattern 170 and the second epitaxial pattern 270. The sheet pattern UP1 may be a channel pattern used as the channel region of the transistor. For example, the sheet pattern UP1 may be nanosheets or nanowires.

The first gate insulating film 130 may extend along the upper surface of the lower pattern BP1 and the upper surface of the field insulating film 105. The first gate insulating film 130 may wrap the periphery of the sheet pattern UP1. The second gate insulating film 230 may extend along the upper surface of the lower pattern BP1 and the upper surface of the field insulating film 105. The second gate insulating film 230 may wrap, e.g., surround, the periphery of the sheet pattern UP1. The third gate insulating film 330 may extend along the upper surface of the lower pattern BP1 and the upper surface of the field insulating film 105. The third gate insulating film 330 may wrap, e.g., surround, the periphery of the sheet pattern UP1.

In FIG. 13, the first gate spacer 140 may include a first outer spacer 141 and a first inner spacer 142. The first inner spacer 142 may be placed between the lower pattern BP1 and the sheet pattern UP1, and between the adjacent sheet patterns UP1. The second gate spacer 240 may include a second outer spacer 241 and a second inner spacer 242. The second inner spacer 242 may be placed between the lower pattern BP1 and the sheet pattern UP1, and between the adjacent sheet patterns UP1. The third gate spacer 340 may include a third outer spacer 341 and a third inner spacer 342. The third inner spacer 342 may be placed between the lower pattern BP1 and the sheet pattern UP1, and between the adjacent sheet patterns UP1.

FIGS. 17 to 34 are cross-sectional views of stages in a method for fabricating the semiconductor device according to some embodiments.

Figure 17:
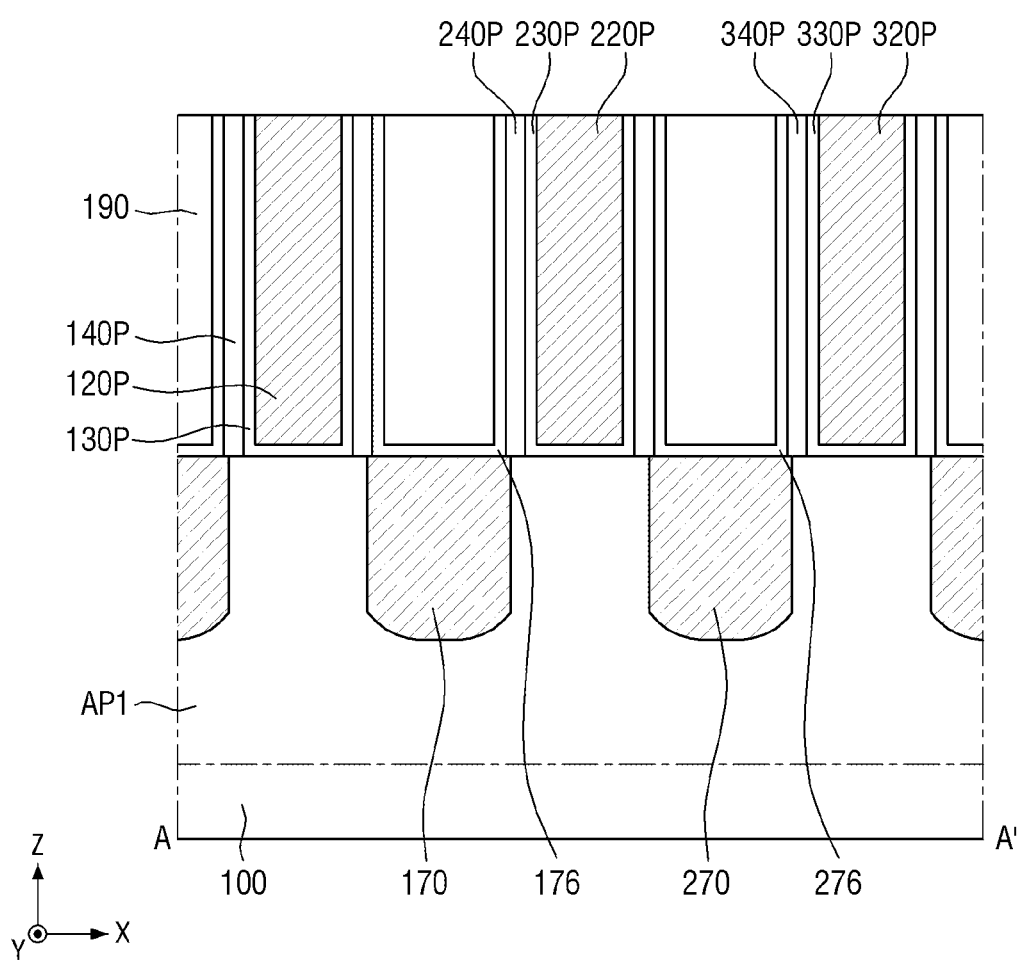
FIGS. 17 to 34 are cross-sectional views of stages in a method for fabricating a semiconductor device according to some embodiments.

Referring to FIG. 17, the first epitaxial pattern 170 and the second epitaxial pattern 270 may be formed on the first active pattern AP1. First to third pre gate insulating films 130P, 230P and 330P, first to third pre gate electrodes 120P, 220P and 320P, first to third pre gate spacers 140P, 240P and 340P, the first etching stop film 176, the second etching stop film 276, and the interlayer insulating film 190 may be formed on the first active pattern AP1.

The first etching stop film 176 may extend along the side walls of the first pre gate spacer 140P, the upper surface of the first epitaxial pattern 170, and the side walls of the second pre gate spacer 240P. The second etching stop film 276 may extend along the side walls of the second pre gate spacer 240P, the upper surface of the second epitaxial pattern 270, and the side walls of the third pre gate spacer 340P. The interlayer insulating film 190 may be formed on the first etching stop film 176 and the second etching stop film 276.

Figure 18:
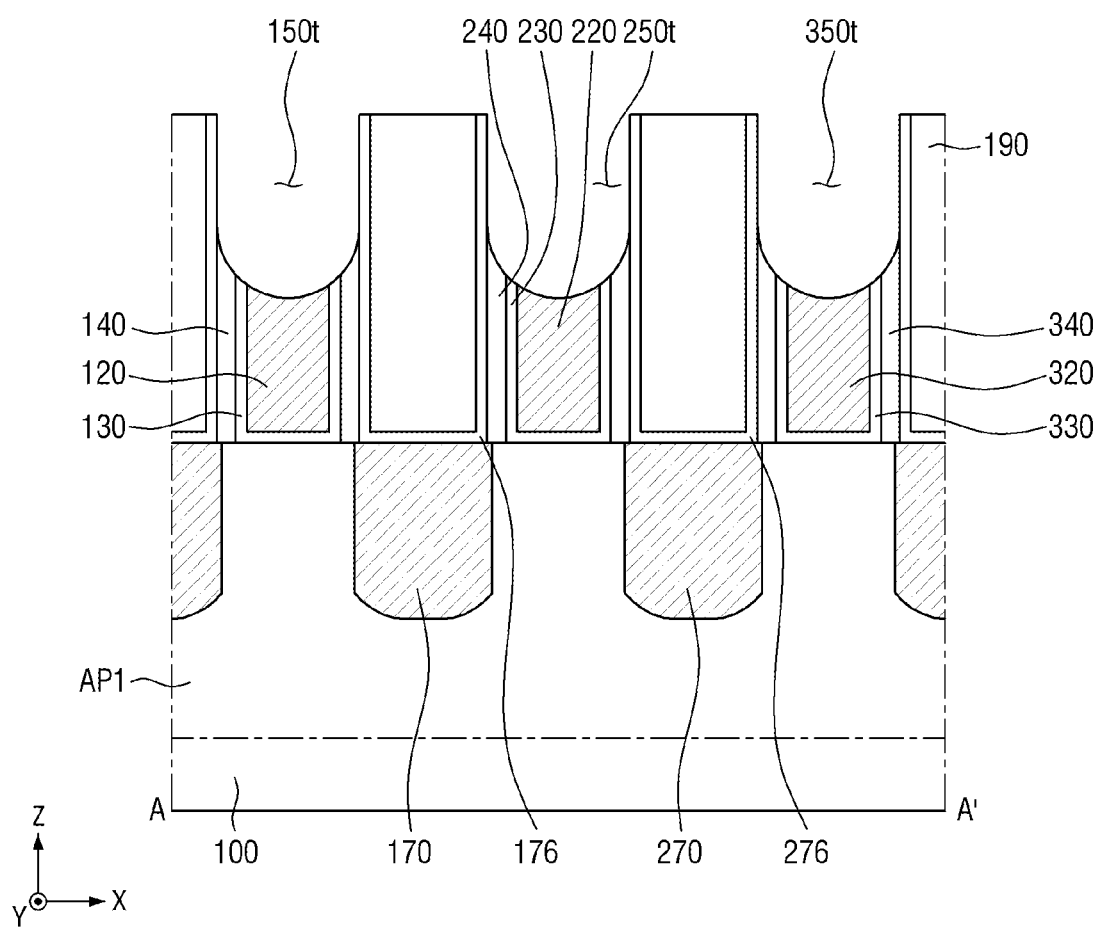

Referring to FIG. 18, a first gate capping trench 150t, a second gate capping trench 250t, and a third gate capping trench 350t may be formed. Although lower surfaces of the first to third gate capping trenches 150t, 250t and 350t are shown to have a wavy shape, embodiments are not limited thereto, e.g., the lower surfaces of the first to third gate capping trenches 150t, 250t and 350t may have a flat shape.

Figure 19:
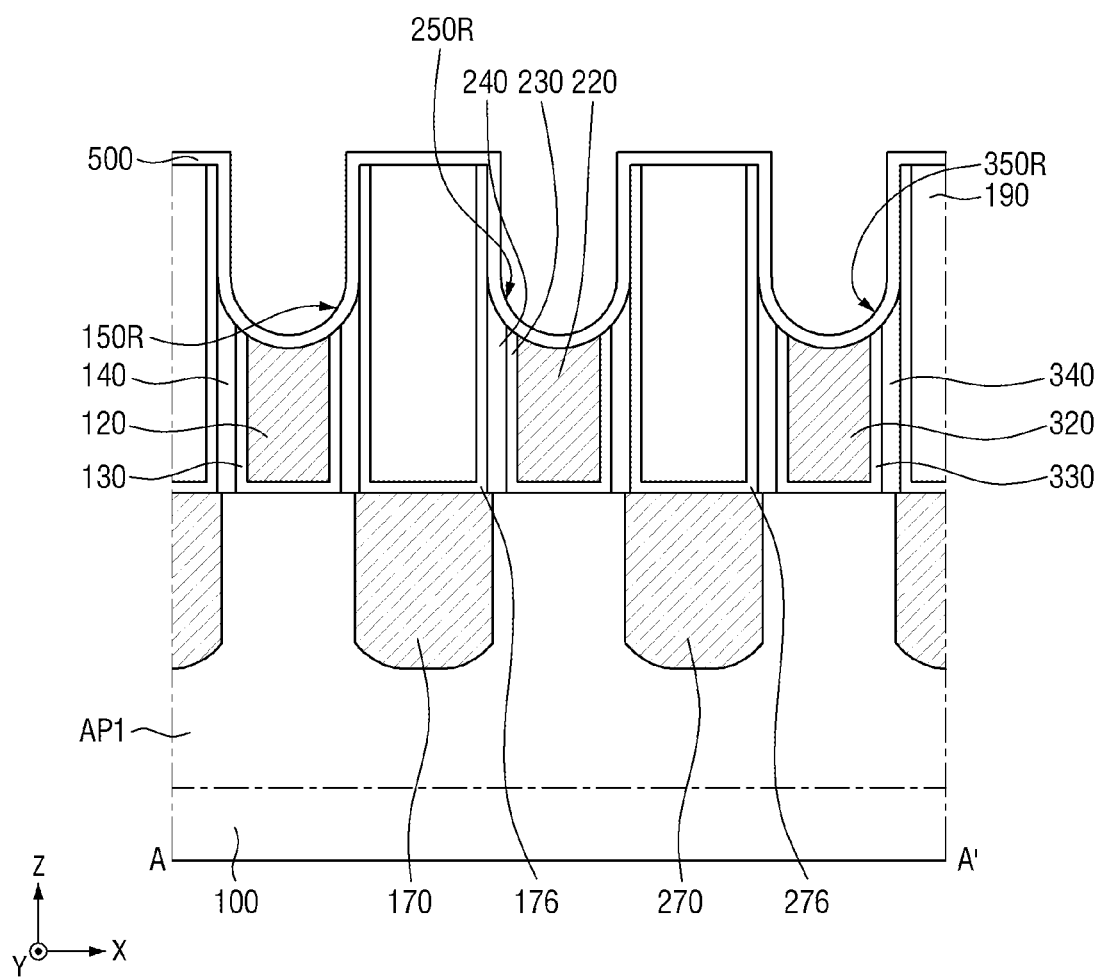

Referring to FIG. 19, a pre gate capping liner 500 may be formed along the profile of the first gate capping trench 150t, the profile of the second gate capping trench 250t, the profile of the third gate capping trench 350t, and the upper surface of the interlayer insulating film 190. The pre gate capping liner 500 may define first to third gate capping recesses 150R, 250R and 350R.

The pre gate capping liner 500 may be formed conformally. The pre gate capping liner may be formed using, e.g., an atomic layer deposition (ALD) process. Contents of the material included in the pre gate capping liner 500 may be the same as the description of the material included in the first gate capping liner. Although the pre gate capping liner 500 is shown as a single film, embodiments area not limited thereto, e.g., the pre gate capping liner 500 may be a double film or a triple film.

Figure 20:
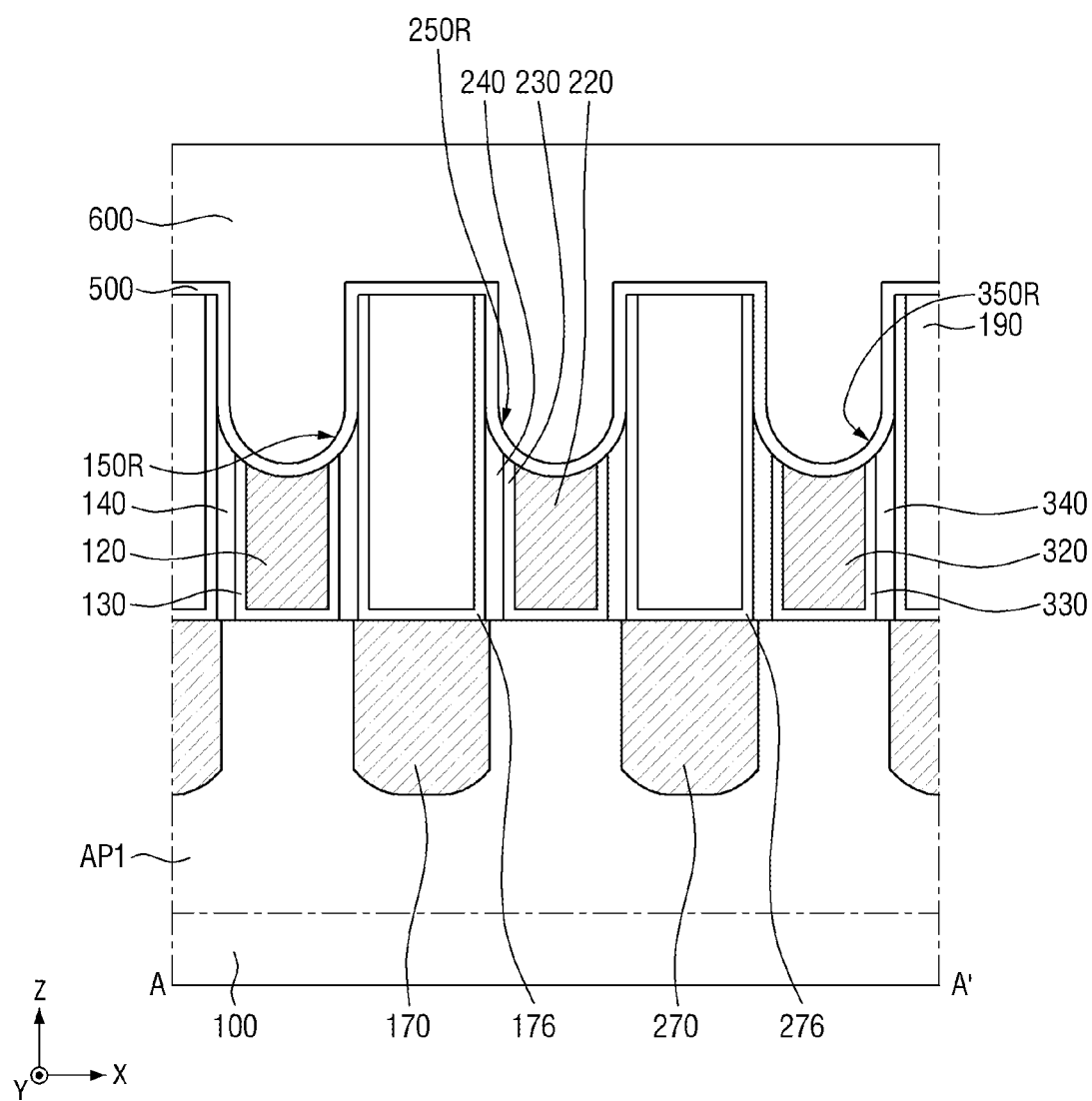

Referring to FIG. 20, a pre gate capping filling film 600 may be formed on the pre gate capping liner 500. The pre gate capping filling film 600 may be formed to cover the upper surface of the pre gate capping liner 500. The pre gate capping filling film 600 may fill the first gate capping recess 150R, the second gate capping recess 250R, and the third gate capping recess 350R. The contents of the material included in the pre gate capping filling film 600 may be the same as the description of the material included in the first gate capping filling film.

Figure 21:
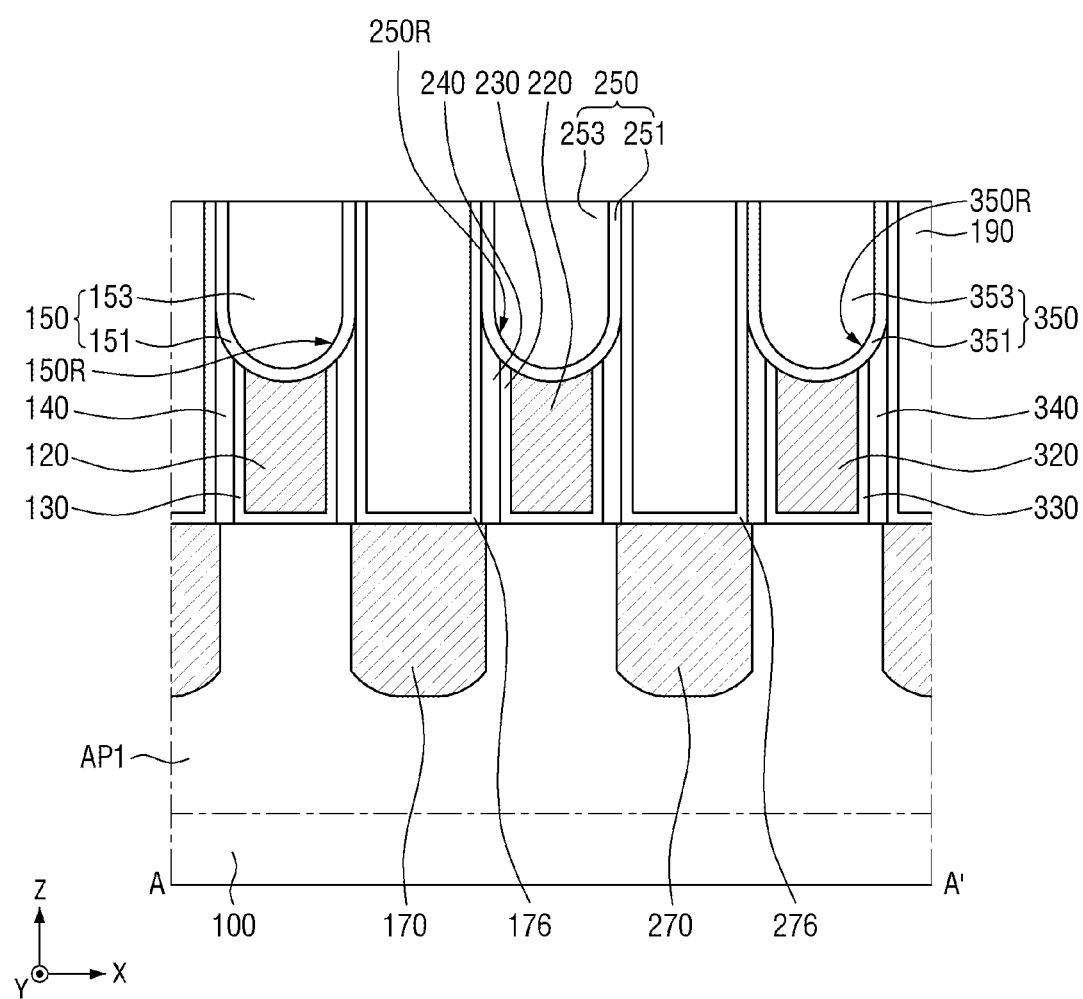

Referring to FIG. 21, the first gate capping pattern 150, the second gate capping pattern 250, and the third gate capping pattern 350 may be formed, by removing a part of the pre gate capping filling film 600 and a part of the pre gate capping liner 500. The first gate capping pattern 150 includes the first gate capping liner 151 that defines the first gate capping recess 150R, and the first gate capping filling film 153 that fills the first gate capping recess 150R. The second gate capping pattern 250 and the third gate capping pattern 350 may be substantially the same as the first gate capping pattern 150.

Figure 22:
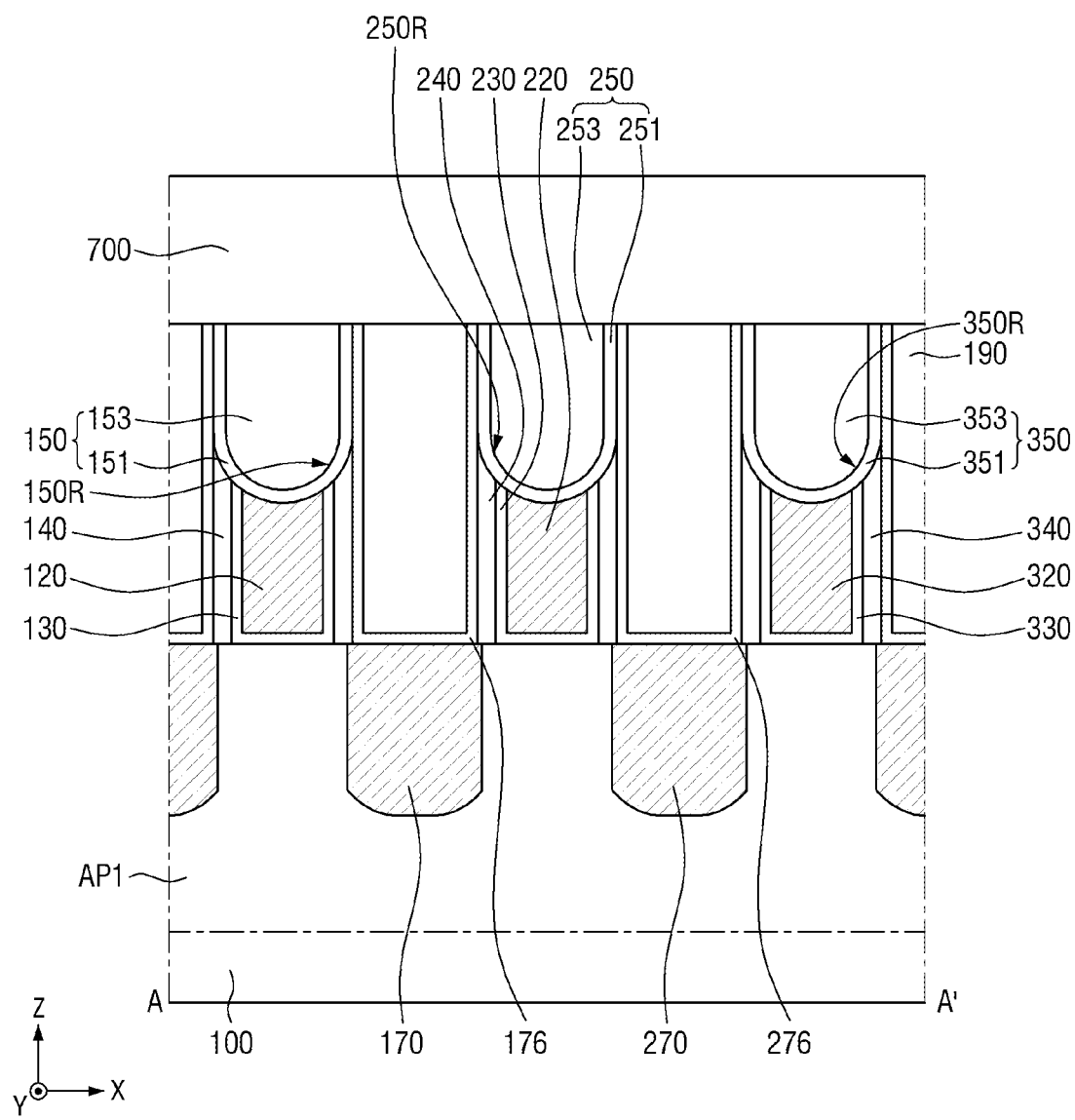

Referring to FIG. 22, a mask film 700 may be formed on the first gate capping pattern 150, the second gate capping pattern 250, the third gate capping pattern 350, and the interlayer insulating film 190. The mask film 700 may be formed to cover the upper surfaces of the interlayer insulating film 190, the first gate capping pattern 150, the second gate capping pattern 250, and the third gate capping pattern 350. Although the mask film 700 may include, e.g., an oxide-based insulating material, embodiments are not limited thereto.

Figure 23:
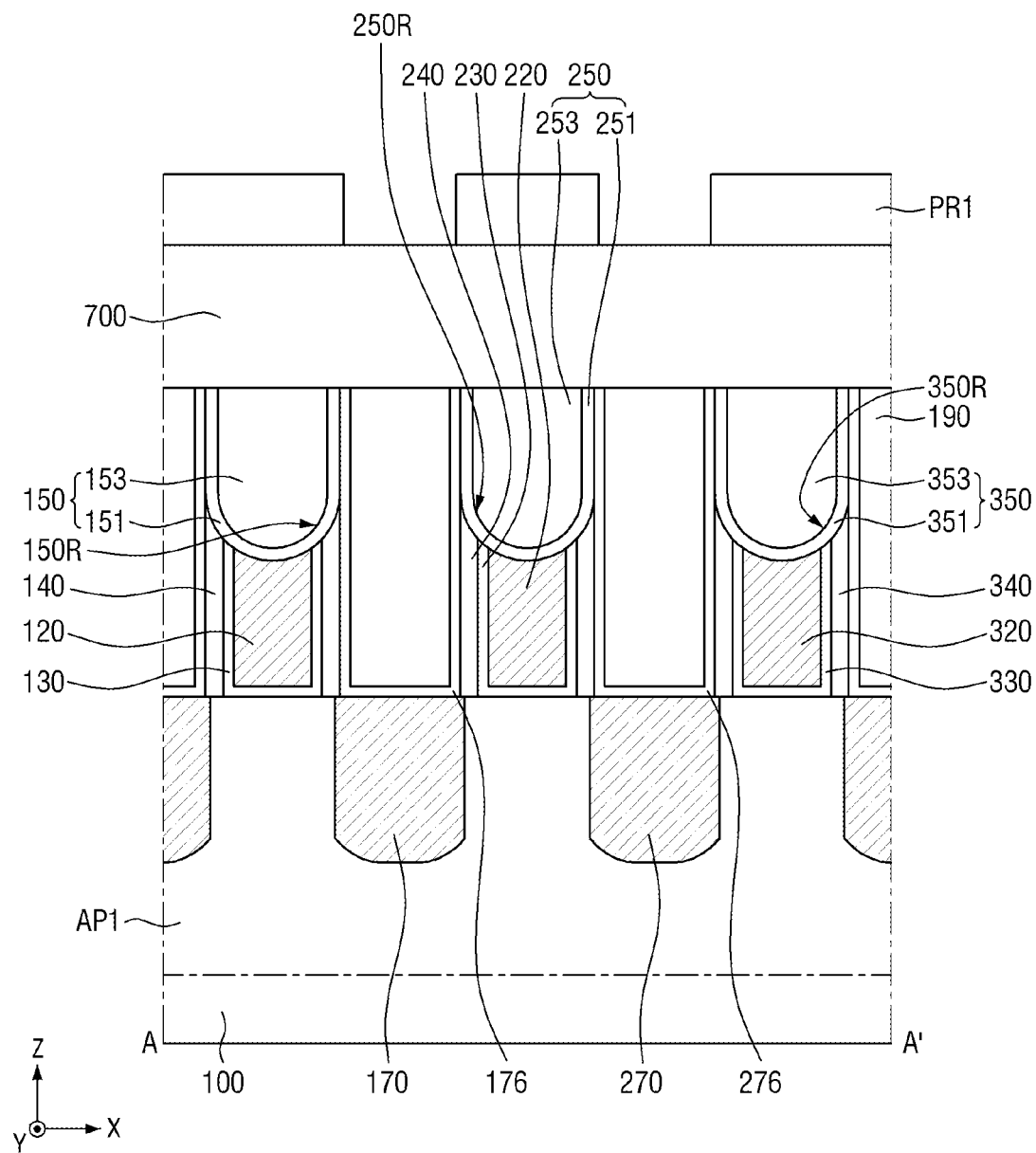

Referring to FIG. 23, the first photoresist PR1 may be formed on the mask film 700. The first photoresist PR1 may be used to form a first active contact and a second active contact, which will be described below.

Figure 24:
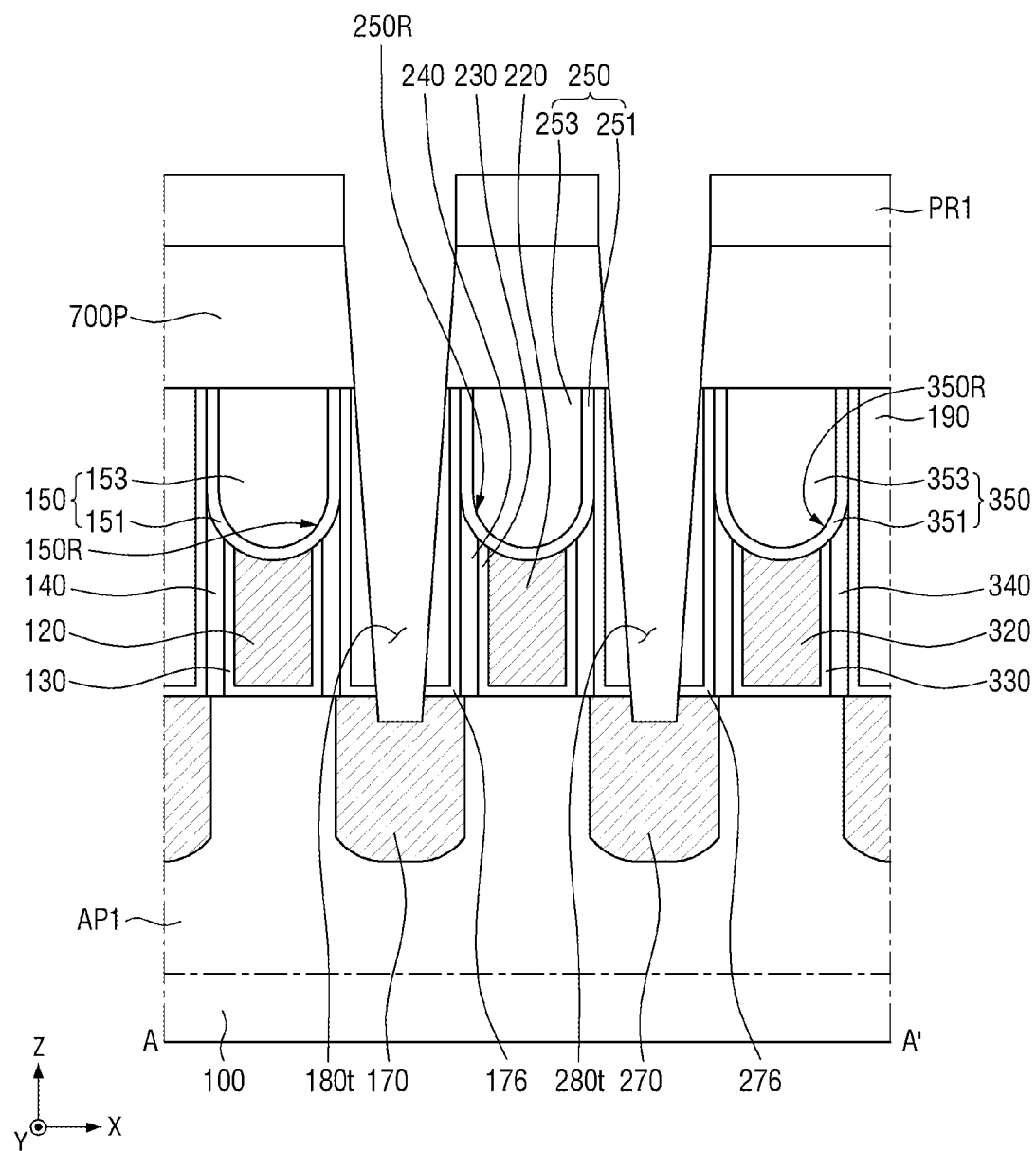

Referring to FIG. 24, a mask pattern 700P, a first trench 180t, and a second trench 280t may be formed, using the first photoresist PR1 as a mask. The first trench 180t may be a trench for forming a first active contact. The second trench 280t may be a trench for forming a second active contact.

Figure 25:
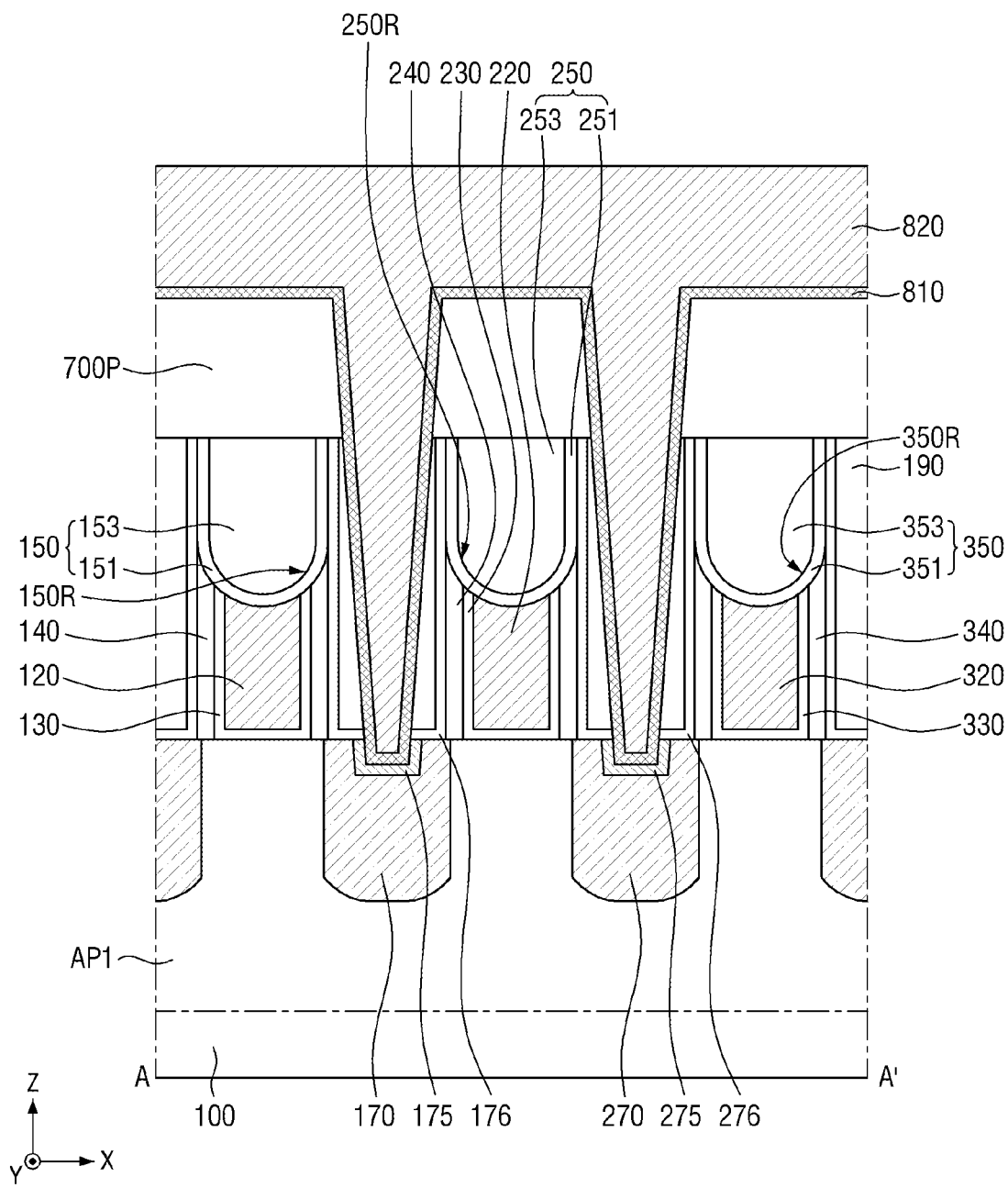

Referring to FIG. 25, the first photoresist PR1 may be removed. Subsequently, a pre active barrier film 810 may be formed along the profile of the first trench 180t, the profile of the second trench 280t, and the upper surface of the mask pattern 700P. A first silicide film 175 may be formed at a portion in which the pre active barrier film 810 and the first epitaxial pattern 170 are in contact with each other. A second silicide film 275 may be formed at a portion in which the pre active barrier film 810 and the second epitaxial pattern 270 are in contact with each other.

A pre active filling film 820 that fills the first trench 180t and the second trench 280t may be formed on the pre active barrier film 810. Contents of the materials included in the pre active barrier film 810 and the pre active filling film 820 are the same as the description of the materials included in the first active barrier film and the first active filling film.

Figure 26:
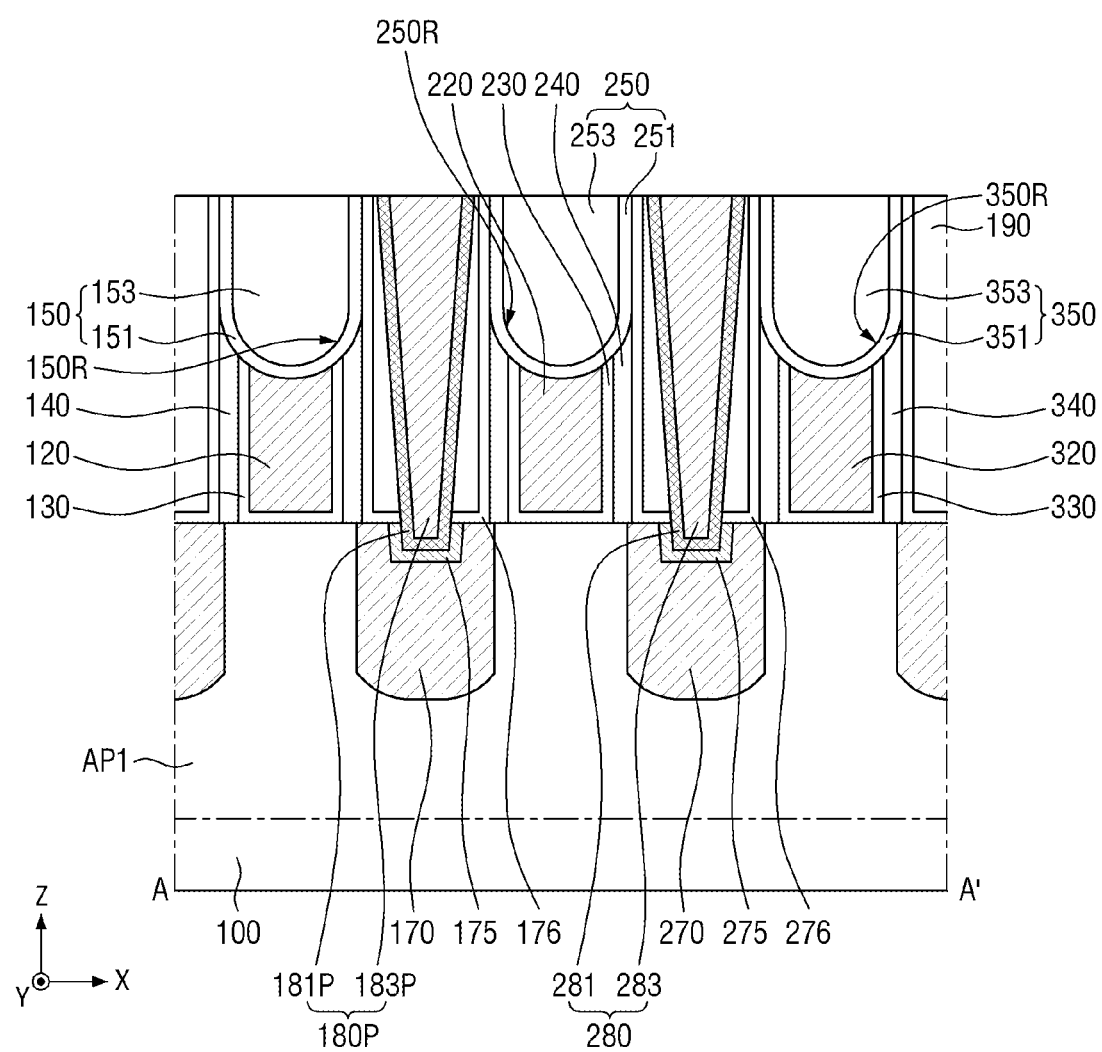

Referring to FIG. 26, a pre first active contact 180P and a second active contact 280 may be formed, by removing a part of the pre active barrier film 810, a part of the pre active filling film 820, and the mask pattern 700P. The pre first active contact 180P may include a pre first active barrier film 181P and a pre first active filling film 183P. The second active contact 280 may include a second active barrier film 281 and a second active filling film 283.

Figure 27:
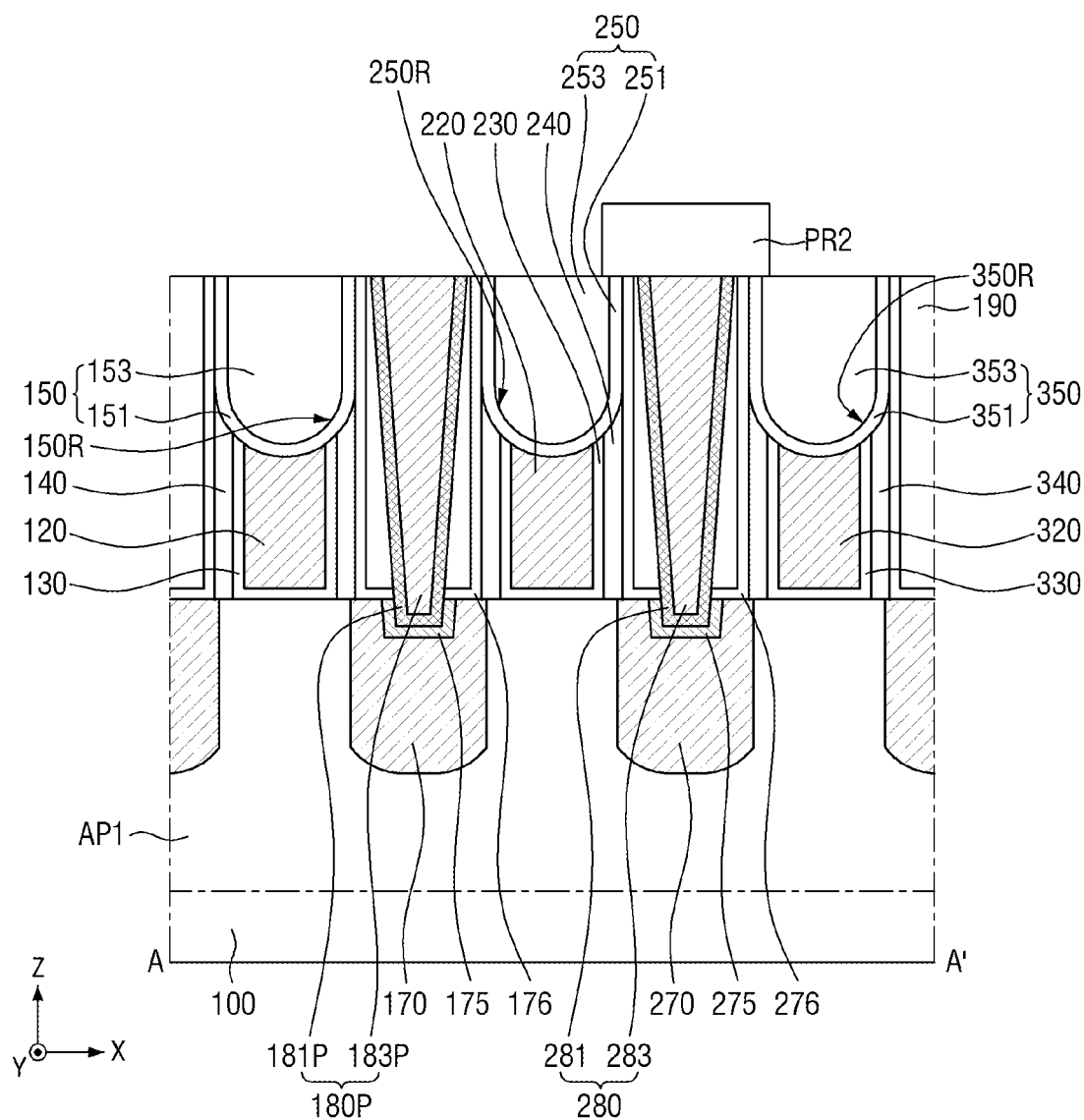

Referring to FIG. 27, a second photoresist PR2 may be formed on the second active contact 280. The second photoresist PR2 may be formed to overlap the second active contact 280 in the third direction Z.

Figure 28:
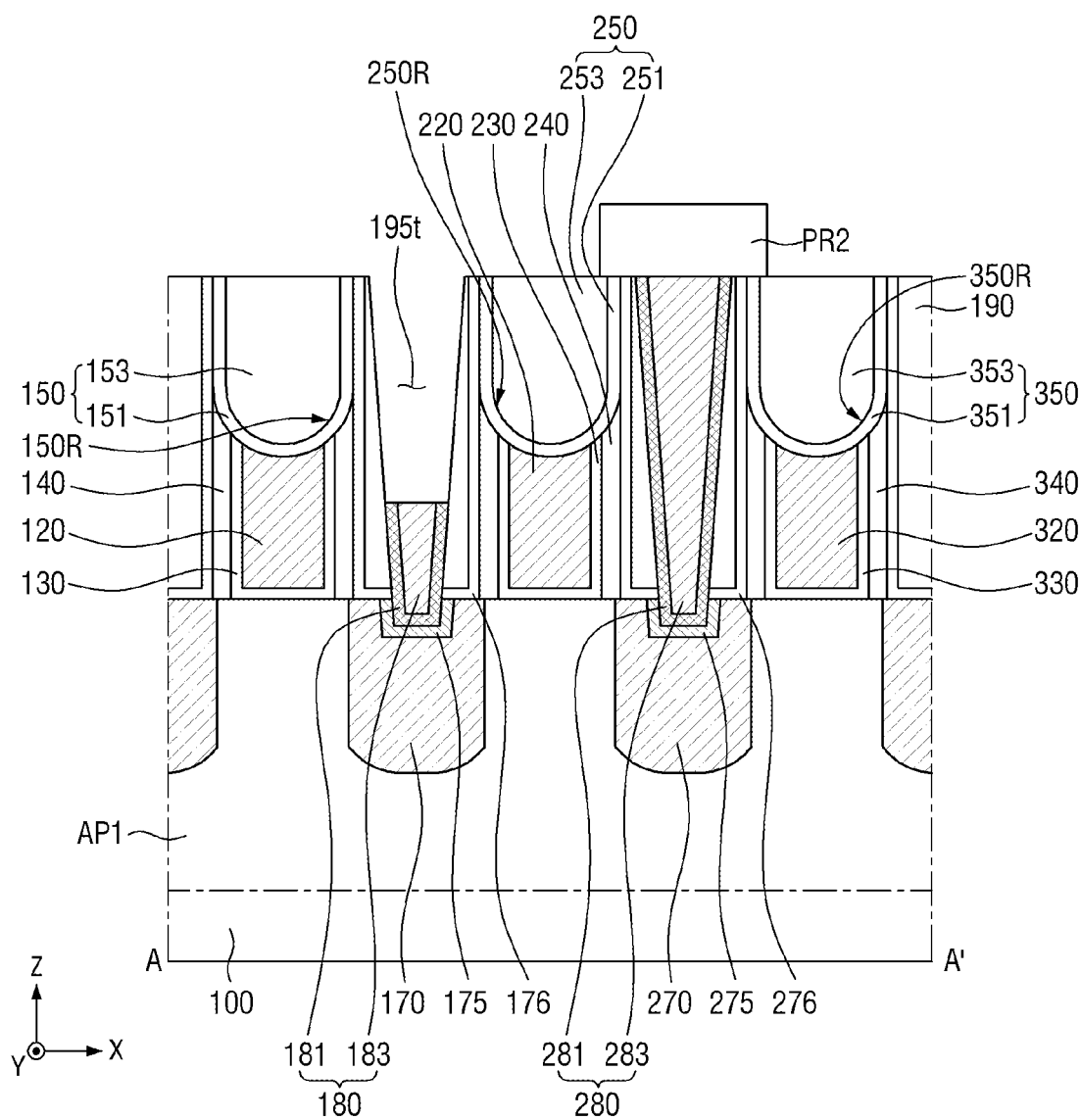

Referring to FIG. 28, an interlayer insulating film trench 195t may be formed, by removing a part of the pre first active contact 180P, using a second photoresist PR2 as a mask. A first active contact 180 may be formed, by removing a part of the pre first active contact 180P. In terms of a cross-section, the upper surface of the first active contact 180 is lower than the upper surface of the second active contact 280.

Since the etching selectivity of the pre first active contact 180P is different from the etching selectivity of the first gate capping pattern 150, the second gate capping pattern 250 and the third gate capping pattern 350, only the pre first active contact 180P may be removed.

Figure 29:
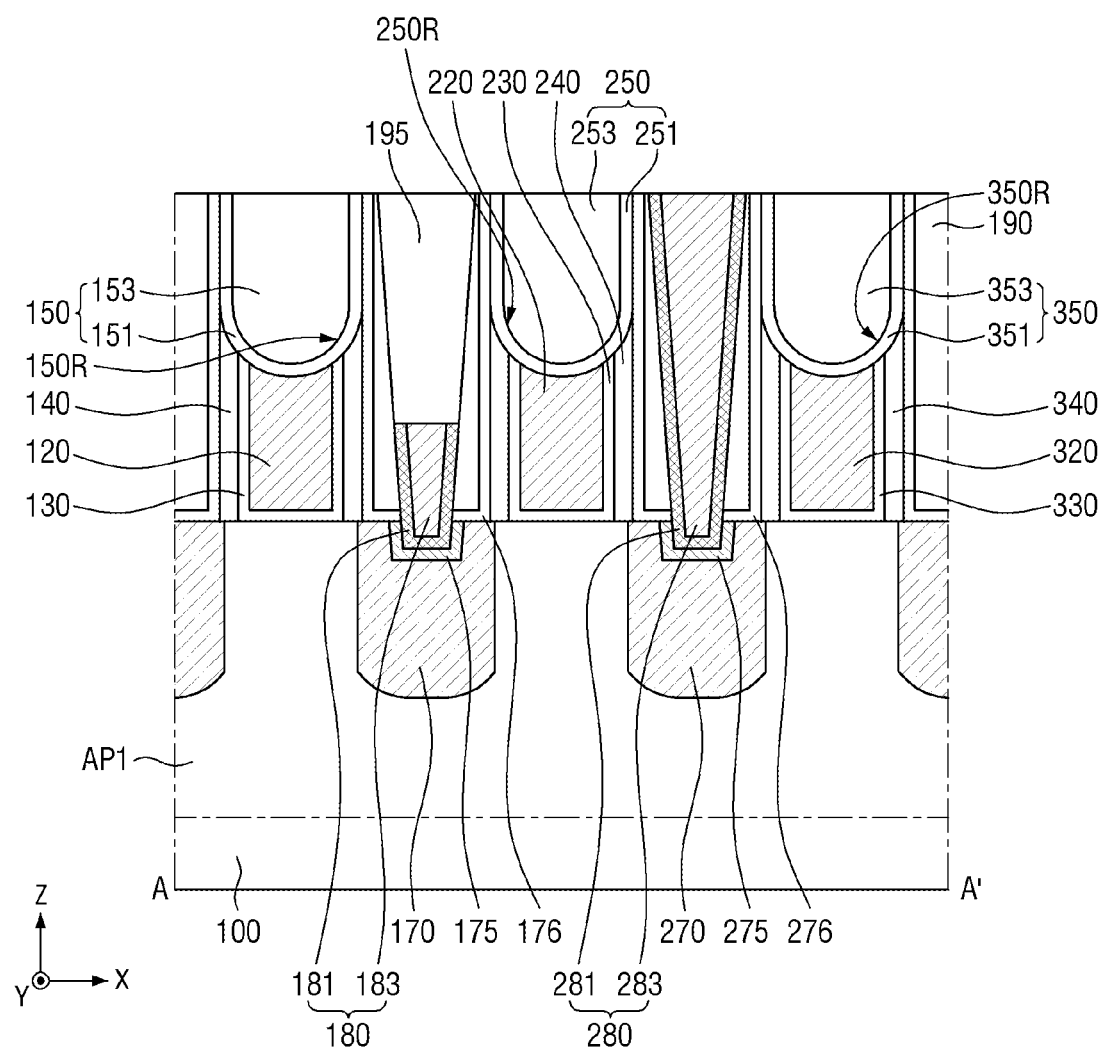

Referring to FIG. 29, an interlayer insulating film 195 that fills the interlayer insulating film trench 195t may be formed. The interlayer insulating film 195 may include, but is not limited to, e.g., silicon oxycarbide (SiOC).

Figure 30:
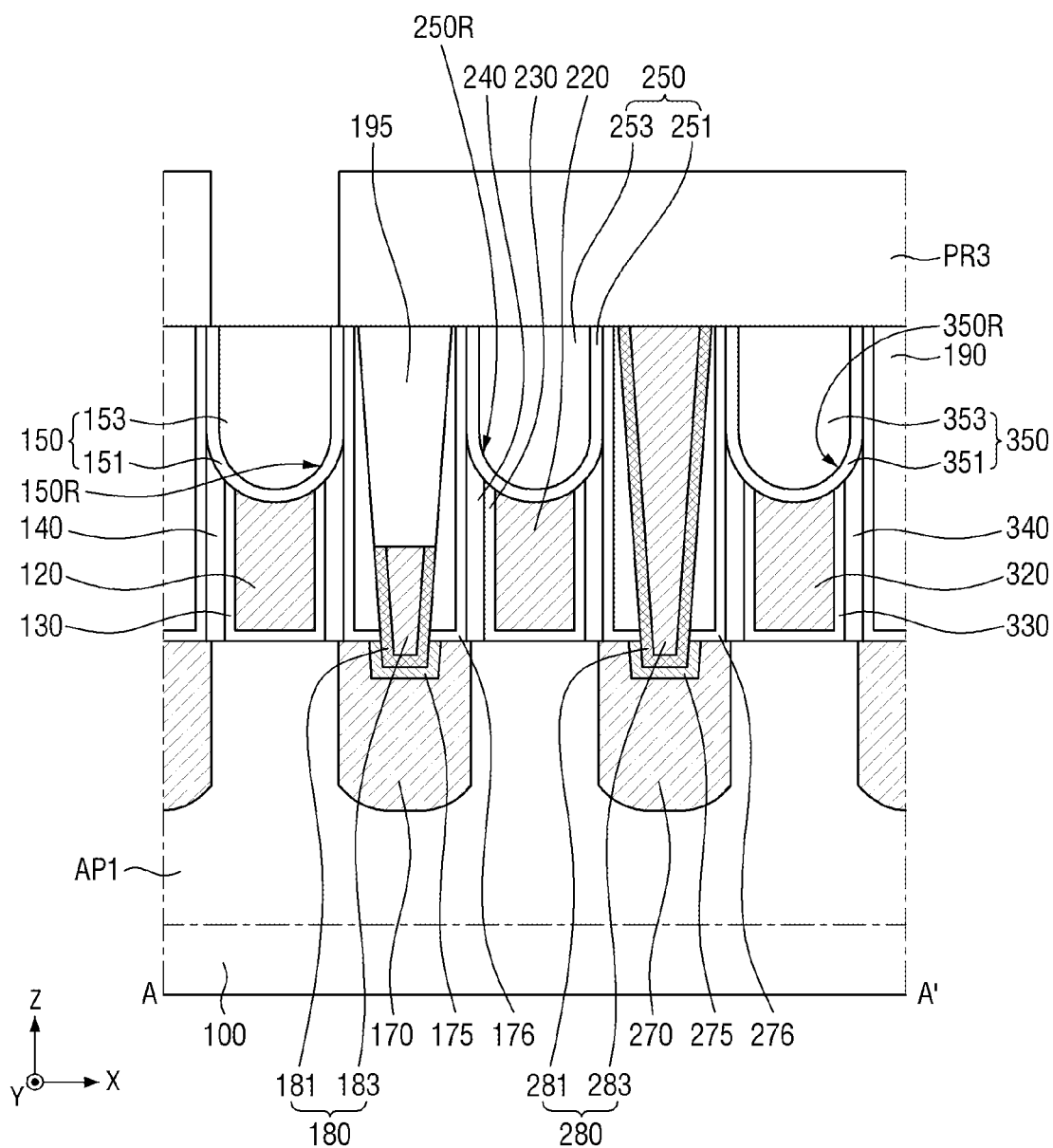

Referring to FIG. 30, the third photoresist PR3 may be formed on the second gate capping pattern 250, the third gate capping pattern 350, and the interlayer insulating films 190 and 195. The third photoresist PR3 may cover the upper surfaces of the second gate capping pattern 250, the third gate capping pattern 350, and the interlayer insulating films 190 and 195. The third photoresist PR3 may overlap the upper surfaces of the second gate capping pattern 250, the third gate capping pattern 350, and the interlayer insulating film 190 in the third direction Z. The third photoresist PR3 may expose, e.g., only, a part of the upper surface of the first gate capping pattern 150.

Figure 31:
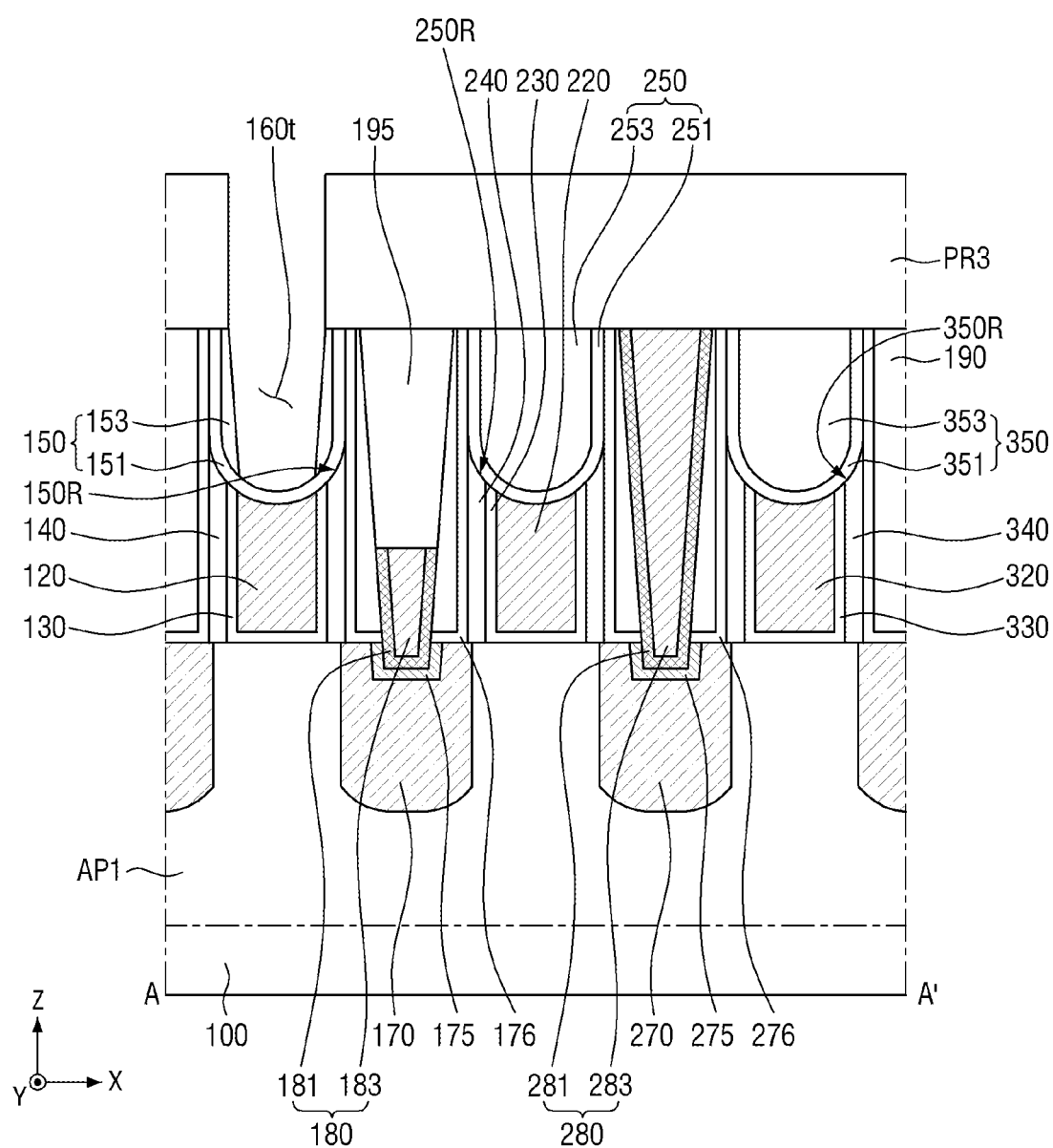

Referring to FIG. 31, a gate contact trench 160t may be formed, using the third photoresist PR3 as a mask. For example, as illustrated in FIG. 31, the first gate capping pattern 150 may be etched through the opening in the third photoresist PR3 to form the gate contact trench 160t to a predetermined depth within the first gate capping pattern, e.g., a portion of the first gate capping filling film 153 may be removed to expose a portion of the upper surface of the first gate capping liner 151. A lower surface of the gate contact trench 160t may be the same as the upper surface of the first gate capping liner 151.

Figure 32:
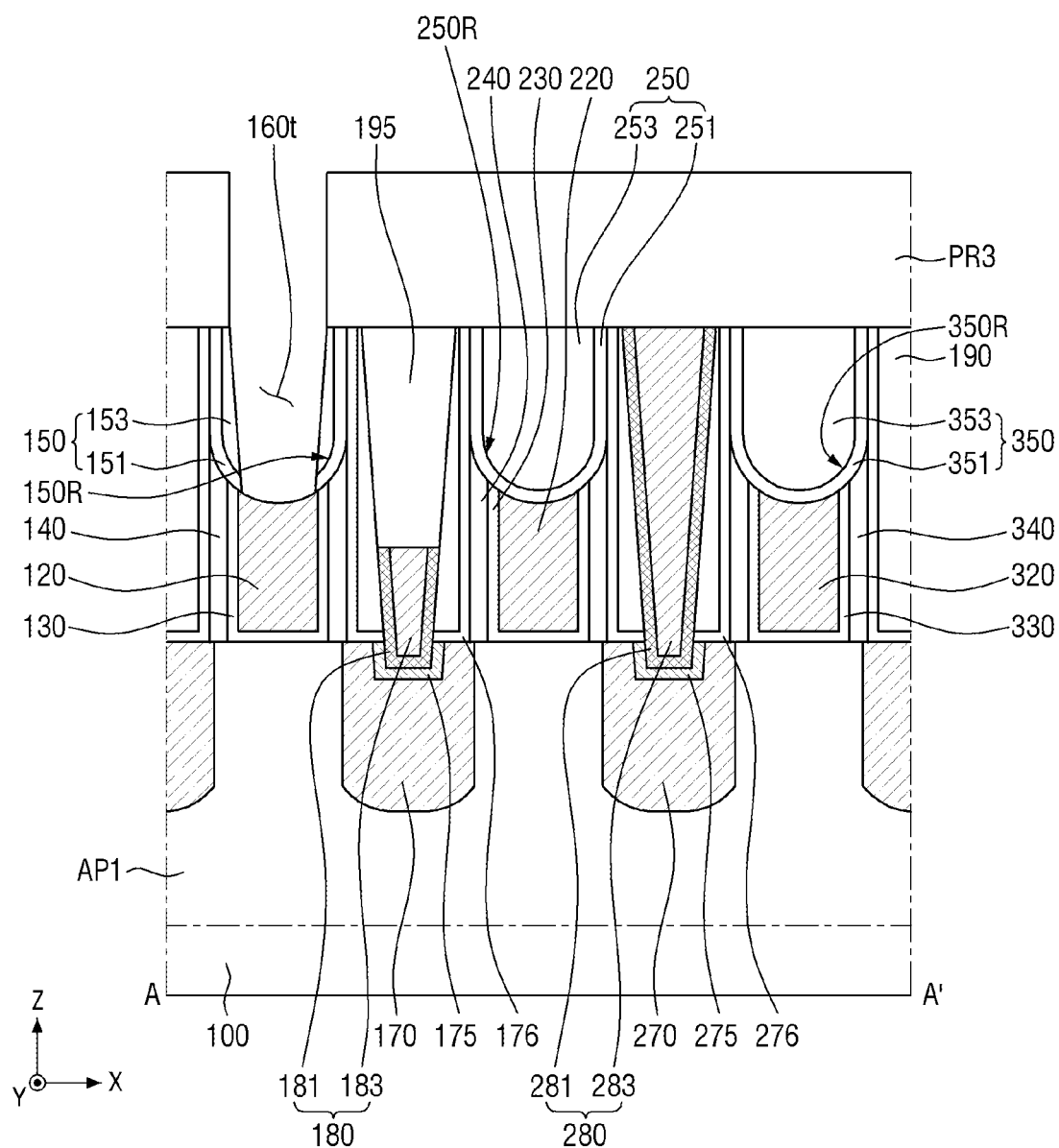

Referring to FIG. 32, a part of the first gate capping liner 151 may be removed. The first gate capping liner 151 that overlaps the lower surface of the gate contact trench 160t in the third direction Z may be removed. The first gate capping liner 151 may be removed, using a wet etching process. The gate contact trench 160t may expose the first gate electrode 120, e.g., the portion of the first gate capping liner 151 exposed by the gate contact trench 160t may be completely removed by the wet etching to expose the gate electrode 120. The lower surface of the gate contact trench 160t may be the same as the upper surface of the first gate electrode 120.

Figure 33:
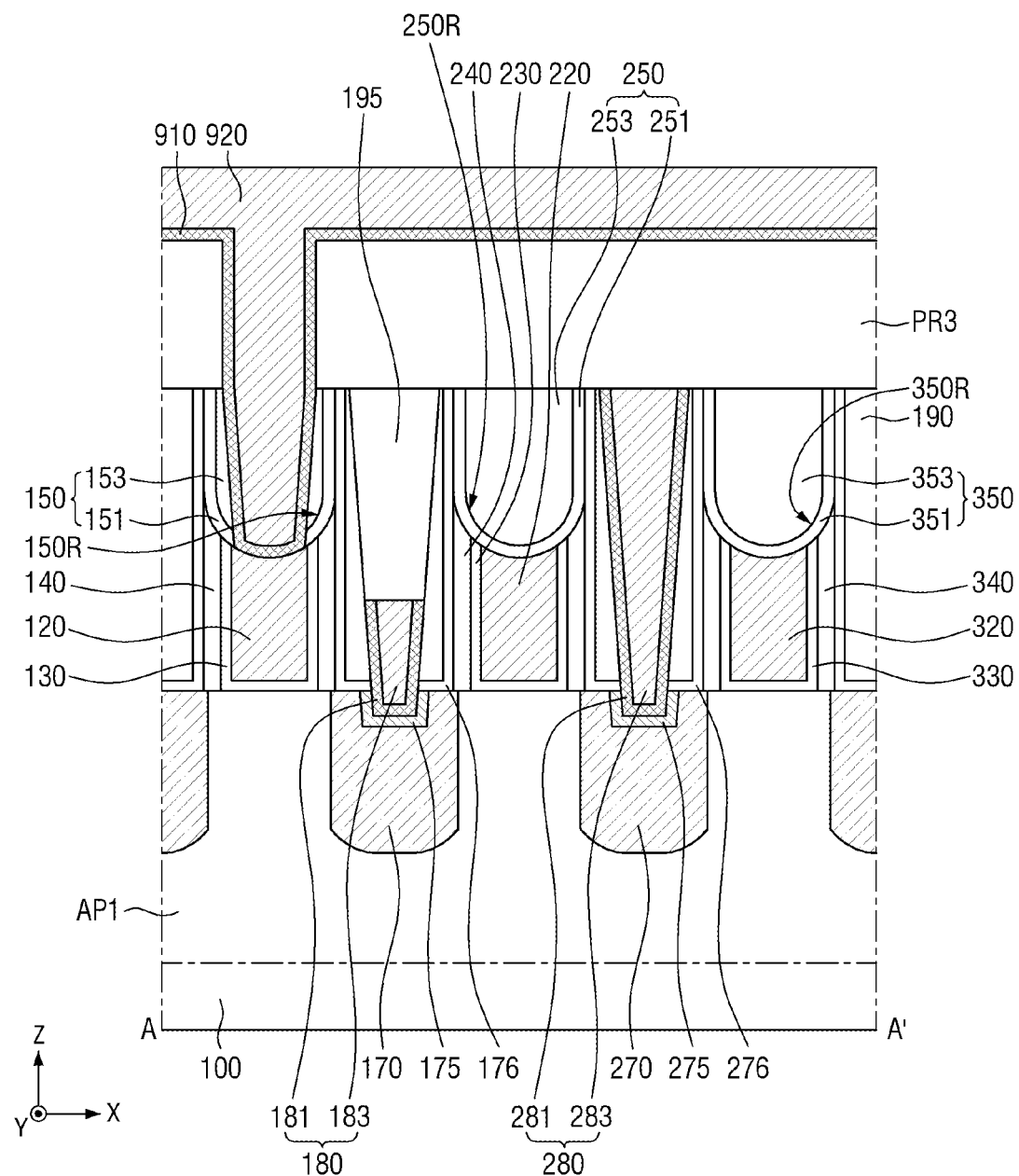

Referring to FIG. 33, a pre gate barrier film 910 extending along a profile of the gate contact trench 160t and the upper surface of the third photoresist PR3 may be formed. A pre gate filling film 920 may be formed on the pre gate barrier film 910. The materials of the pre gate barrier film 910 and the pre gate filling film 920 are the same as those of the gate barrier film and the gate filling film.

Figure 34:
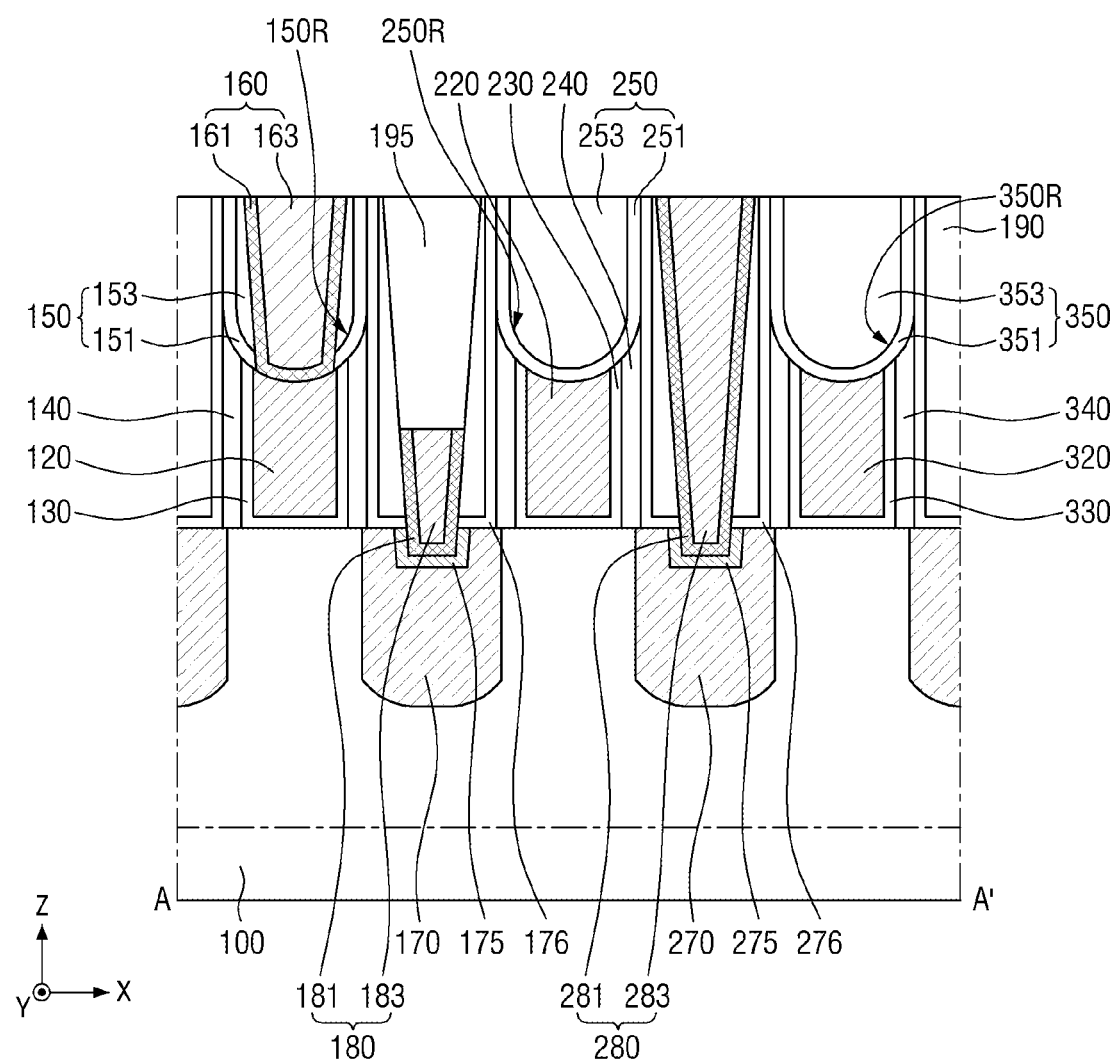

Referring to FIG. 34, the gate contact 160 may be formed, by removing a part of the pre gate barrier film 910, and a part of the pre gate filling film 920. The gate contact 160 may include the gate barrier film 161 and the gate filling film 163.

By way of summation and review, as a pitch size of the semiconductor device decreases, a decrease in capacitance and increased electrical stability between contacts in the semiconductor device may be required. Therefore, aspects of the present disclosure provide a semiconductor device capable of improving device performance and reliability.

That is, embodiment are directed to a method of etching a metal gate to a desired height when forming a gate contact. More specifically, an etching stop layer is formed on the metal gate by forming a gate capping liner (e.g., ALN/ODC) on the metal gate, and a gate capping filling film (e.g., SiN) on the gate capping liner. As the gate capping filling film is etched by a dry etching process, and the gate capping liner is subsequently etched by a wet etching process, e.g., in two separate processes, portions of the gate capping filling film and the gate capping liner may remain between the gate contact (formed subsequently on the metal gate) and an adjacent contact.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active pattern extending in a first direction on a substrate;
a first gate structure on the active pattern, the first gate structure including:
a first gate electrode intersecting the active pattern, the first gate electrode extending in a second direction intersecting the first direction, and
a first gate capping pattern on the first gate electrode, the first gate capping pattern including:
a first lower gate capping liner defining a first gate capping recess, the first lower gate capping liner having a first horizontal portion extending along an upper surface of the first gate electrode, and a first vertical portion extending from the first horizontal portion in a third direction intersecting the first direction and the second direction, and
a first gate capping filling film on the first lower gate capping liner and filling the first gate capping recess;
a second gate structure extending in the second direction, the second gate structure being spaced apart from the first gate structure in the first direction;
a first epitaxial pattern on the active pattern, the first epitaxial pattern being between the first gate structure and the second gate structure;
a gate contact on and connected to the first gate electrode, wherein the first gate capping filing film is disposed in a space between the first lower gate capping liner and the gate contact; and
a first active contact on and connected to the first epitaxial pattern.

2. The semiconductor device as claimed in claim 1, further comprising:
a third gate structure extending in the second direction, the third gate structure being spaced apart from the second gate structure in the first direction, and the second gate structure being between the first gate structure and the third gate structure;
a second epitaxial pattern on the active pattern, the second epitaxial pattern being between the second gate structure and the third gate structure; and
a second active contact on and connected to the second epitaxial pattern, an upper surface of the second active contact being higher than an upper surface of the first active contact.

3. The semiconductor device as claimed in claim 1, wherein an upper surface of the first vertical portion is higher than an upper surface of the first active contact.

4. The semiconductor device as claimed in claim 1, further comprising:
a first upper gate capping liner on the first lower gate capping liner, an etching selectivity of the first lower gate capping liner and an etching selectivity of the first upper gate capping liner being different from each other.

5. The semiconductor device as claimed in claim 4, wherein the first lower gate capping liner includes aluminum.

6. The semiconductor device as claimed in claim 1, wherein the first gate structure includes a first gate spacer on side walls of the first gate electrode, at least a part of the first horizontal portion of the first lower gate capping liner overlapping an upper surface of the first gate spacer in the third direction.

7. The semiconductor device as claimed in claim 1, wherein the active pattern includes a fin-type pattern.

8. The semiconductor device as claimed in claim 1, wherein the active pattern includes a sheet pattern.

9. A semiconductor device, comprising:
an active pattern extending in a first direction on a substrate;
a first gate structure on the active pattern, the first gate structure including:
  a first gate electrode intersecting the active pattern, the first gate electrode extending in a second direction intersecting the first direction, and
  a first gate capping pattern on the first gate electrode, the first gate capping pattern including:
    a first lower gate capping liner defining a first gate capping recess, and
    a first gate capping filling film on the first lower gate capping liner, the first gate capping filling film filling the first gate capping recess;
a second gate structure extending in the second direction, the second gate structure being spaced apart from the first gate structure in the first direction;
a first epitaxial pattern on the active pattern, the first epitaxial pattern being between the first gate structure and the second gate structure;
a first active contact on and connected to the first epitaxial pattern, the first lower gate capping liner being on a part of side walls of the first active contact and extending to an upper surface of the first active contact; and
a gate contact on and connected to the first gate electrode, wherein the first gate capping filing film is disposed in a space between the first lower gate capping liner and the gate contact.

10. The semiconductor device as claimed in claim 9, further comprising:
a first upper gate capping liner on the first lower gate capping liner, an etching selectivity of the first lower gate capping liner and an etching selectivity of the first upper gate capping liner being different from each other.

11. The semiconductor device as claimed in claim 10, wherein the first lower gate capping liner includes aluminum.

12. The semiconductor device as claimed in claim 9, wherein the first lower gate capping liner includes:
a first horizontal portion extending along an upper surface of the first gate electrode, and
a first vertical portion extending from the first horizontal portion in a third direction intersecting the first direction and the second direction, an upper surface of the first vertical portion being on a same plane as the upper surface of the first active contact.

13. The semiconductor device as claimed in claim 12, wherein the first vertical portion includes:
a first short vertical portion, and
a first long vertical portion spaced apart from the first short vertical portion in the first direction, the first long vertical portion being between the first short vertical portion and a side wall of the first active contact, and an upper surface of the first short vertical portion being lower than an upper surface of the first long vertical portion.

14. The semiconductor device as claimed in claim 9, further comprising:
a third gate structure spaced apart from the first gate structure in the first direction, the first gate structure being between the second gate structure and the third gate structure;
a second epitaxial pattern between the first gate structure and the third gate structure; and
a second active contact on and connected to the second epitaxial pattern,
wherein the first lower gate capping liner includes a first horizontal portion extending along an upper surface of the first gate electrode, and a first vertical portion extending from the first horizontal portion in a third direction intersecting the first direction and the second direction, and
wherein an upper surface of the second active contact is lower than an upper surface of the first vertical portion.

15. The semiconductor device as claimed in claim 9, wherein the active pattern includes a fin-type pattern.

16. The semiconductor device as claimed in claim 9, wherein the active pattern includes a sheet pattern.

17. A semiconductor device, comprising:
an active pattern extending in a first direction on a substrate;
a first gate structure on the active pattern, the first gate structure including:
  a first gate electrode intersecting the active pattern, the first gate electrode extending in a second direction intersecting the first direction, and
  a first gate capping pattern on the first gate electrode, the first gate capping pattern including a first gate capping liner defining a first gate capping recess, and a first gate capping filling film on the first gate capping liner and filling the first gate capping recess;
a second gate structure extending in the second direction, the second gate structure being spaced apart from the first gate structure in the first direction;
a third gate structure extending in the second direction, the third gate structure being spaced apart from the second gate structure in the first direction, and the second gate structure being between the first gate structure and the third gate structure;
a first epitaxial pattern on the active pattern, the first epitaxial pattern being between the first gate structure and the second gate structure;
a second epitaxial pattern on the active pattern, the second epitaxial pattern being between the second gate structure and the third gate structure;
a gate contact on and connected to the first gate electrode;
a first active contact on and connected to the first epitaxial pattern, a lower surface of the gate contact being higher than an upper surface of the first active contact; and
a second active contact on and connected to the second epitaxial pattern.

18. The semiconductor device as claimed in claim 17, wherein an upper surface of the gate contact is on a same plane as an upper surface of the second active contact.

19. The semiconductor device as claimed in claim 18, wherein the first gate capping liner includes:
a first lower gate capping liner; and
a first upper gate capping liner on the first lower gate capping liner, an etching selectivity of the first lower gate capping liner and an etching selectivity of the first upper gate capping liner being different from each other.

20. The semiconductor device as claimed in claim 19, wherein the first lower gate capping liner includes aluminum.

\* \* \* \* \*